US006392979B1

(12) United States Patent
Yamamoto et al.

(10) Patent No.: US 6,392,979 B1
(45) Date of Patent: *May 21, 2002

(54) OPTICAL PICKUP AND OPTICAL DISK APPARATUS USING THE SAME

(75) Inventors: Kazuhisa Yamamoto, Takatsuki; Yasuo Kitaoka, Ibaragi; Ayumu Tsujimura, Osaka; Masahiro Kume, Otsu, all of (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/009,436

(22) Filed: Jan. 20, 1998

(30) Foreign Application Priority Data

Jan. 17, 1997 (JP) .............................................. 9-005995

(51) Int. Cl.[7] ................................................. G11B 7/00
(52) U.S. Cl. ....................................... 369/121; 369/116
(58) Field of Search ........................... 369/44.12, 44.23, 369/44.24, 116, 112, 110, 109, 121

(56) References Cited

U.S. PATENT DOCUMENTS

| 4,978,187 | A | * | 12/1990 | Minemura et al. ............ 369/53 |
| 5,008,891 | A | | 4/1991 | Morita |
| 5,034,942 | A | | 7/1991 | Ohishi et al. |
| 5,113,386 | A | | 5/1992 | Whitehead et al. |
| 5,179,566 | A | * | 1/1993 | Iwano et al. .................... 372/45 |
| 5,233,444 | A | * | 8/1993 | Musha et al. ................... 369/13 |
| 5,276,745 | A | * | 1/1994 | Revelli, Jr. .................... 385/14 |
| 5,303,221 | A | * | 4/1994 | Maeda et al. .............. 369/44.12 |
| 5,306,662 | A | | 4/1994 | Nakamura et al. |
| 5,436,884 | A | * | 7/1995 | Taneya ....................... 369/112 |
| 5,448,548 | A | * | 9/1995 | Taneya et al. ............... 369/121 |
| 5,452,312 | A | * | 9/1995 | Yamamoto et al. ............. 372/5 |
| 5,477,527 | A | | 12/1995 | Tsuchiya et al. |
| 5,499,256 | A | * | 3/1996 | Bischel et al. ................. 372/28 |
| 5,559,822 | A | * | 9/1996 | Oankove et al. ............... 372/50 |
| 5,644,584 | A | * | 7/1997 | Nam et al. ..................... 372/20 |
| 6,194,240 | B1 | * | 2/2001 | Chiu et al. ..................... 438/31 |
| 6,226,233 | B1 | * | 5/2001 | Mcdaniel et al. ......... 369/44.22 |
| 6,246,657 | B1 | * | 6/2001 | Wilde et al. ............ 369/112.09 |

FOREIGN PATENT DOCUMENTS

| EP | 0 279 183 | 8/1988 |
| EP | 487 822 | 6/1992 |
| EP | 615 321 | 9/1994 |
| EP | 709 938 | 5/1996 |
| JP | 60-237648 | 11/1985 |

OTHER PUBLICATIONS

European Search Report dated Jan. 28, 1999 for corresponding European Patent Application EP 98 10 0691.
"Optimum Overlay", IBM Technical Disclosure Bulletin, vol. 37, No. 28, pp. 633 and 634, Feb. 1, 1994.
European Search Report dated Nov. 11, 1998 for corresponding European Patent Application EP 98 10 0691.
European Search Report dated Mar. 19, 2001 for EP 00 12 7273.

* cited by examiner

Primary Examiner—Nabil Hindi
(74) Attorney, Agent, or Firm—Ratner & Prestia

(57) ABSTRACT

Laser light emitted from the wavelength-locked GaN semiconductor laser is collimated through a collimation lens, led through a polarization beam splitter and a ¼ wavelength plate, and converged by a focus lens so as to be radiated on pits formed in an optical disk medium. The signal light from the optical disk medium is collimated by the focus lens, and has its polarization direction turned by the ¼ wavelength plate by 90° relative to its polarization direction before being returned from the optical disk medium. As a result, the signal light is reflected from the polarization beam splitter so as to be converged on the optical detector by the focus lens.

9 Claims, 16 Drawing Sheets

FIG.8F-1

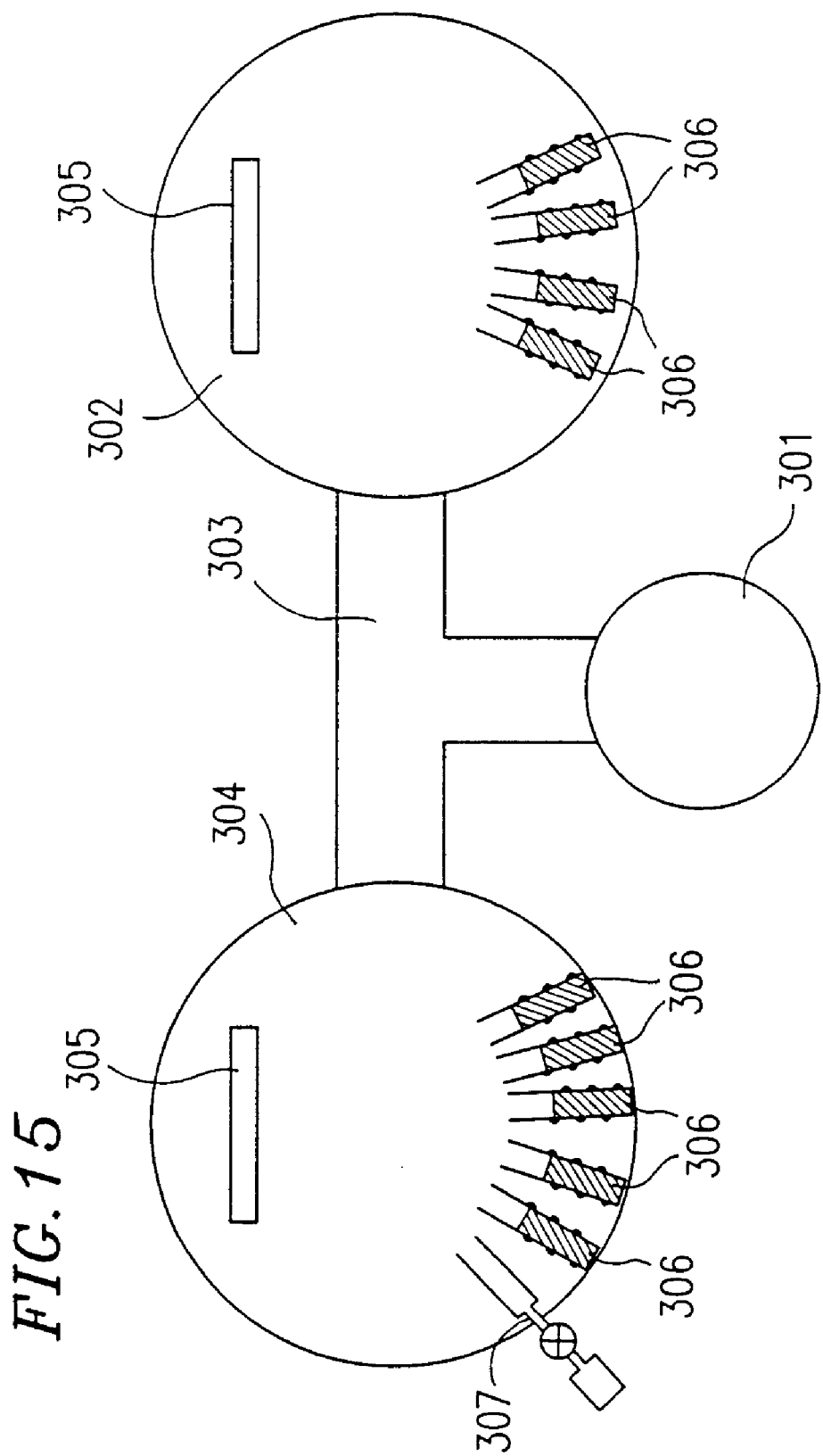

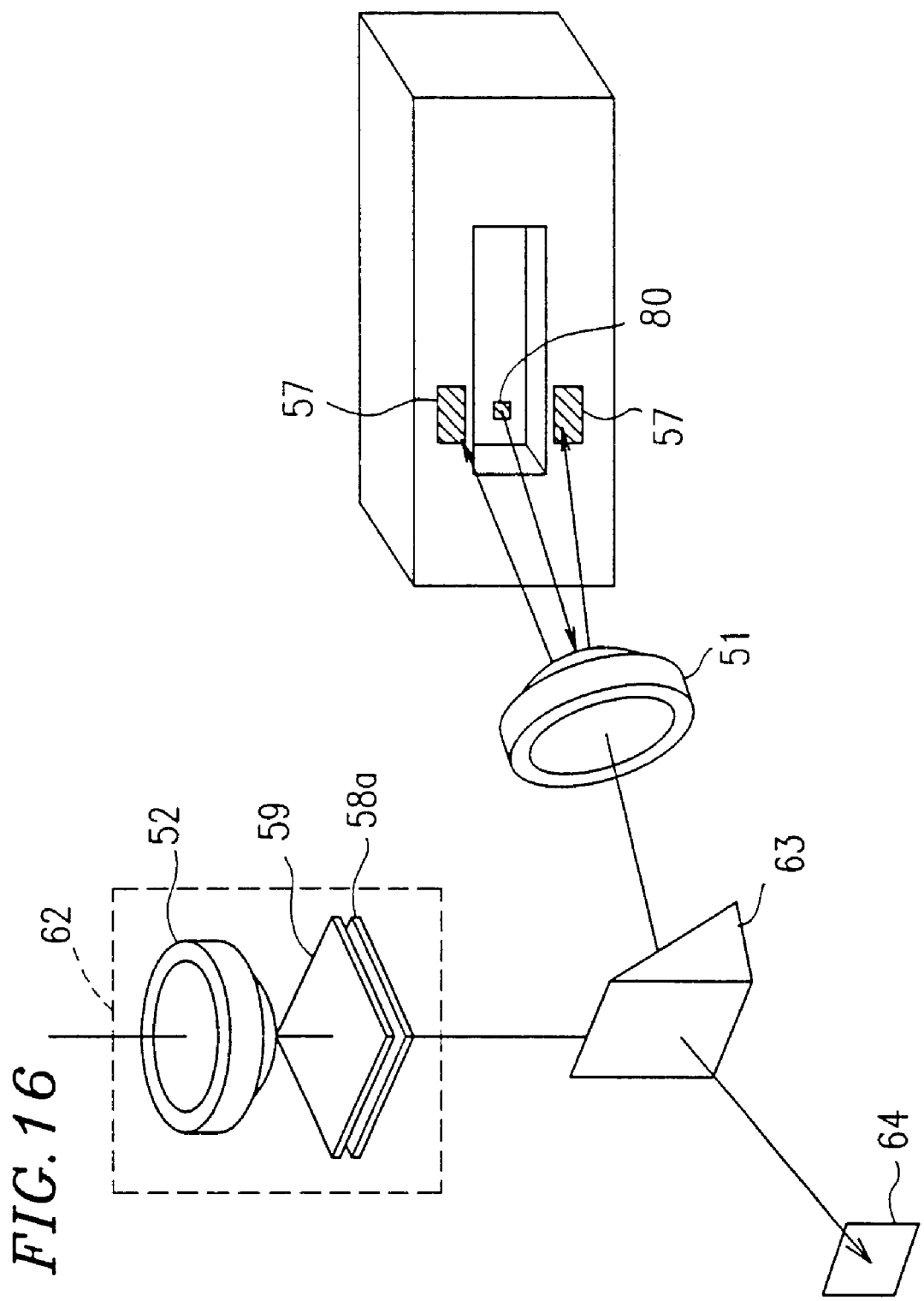

OPTICAL PICKUP AND OPTICAL DISK APPARATUS USING THE SAME

BACKGROUND OF THE INVENTION

1. Field of the Invention

The present invention relates to an optical pickup which utilizes coherent light for use in the field of optical information processing, and also to an optical disk apparatus incorporating the optical pickup.

2. Description of the Related Art

DVDs (digital video disks), which define one species of optical disks, can record 4.7 GB of data per disk medium with a diameter of 12 cm by utilizing a red semiconductor laser. Thus, signals equivalent to about 2 hours of motion pictures in the NTSC format can be recorded/reproduced on a single disk. A semiconductor laser which is employed as a light source in such a DVD apparatus typically generates red laser light with a wavelength of about 635 nm to about 650 nm, and has output power of about 5 mW. The relative intensity of noise (RIN) is generally −130 dB/Hz, thus satisfying the DVD requirement of −126 dB/Hz or smaller RIN.

However, the following problem may occur in a conventional DVD apparatus incorporating the above-described red semiconductor laser when reproducing motion pictures of the HDTV (high definition TV) class, which is one type of high quality TVs that requires high density recording/reproduction as necessitated by increase in the amount of information to be processed.

Specifically, the use of a red semiconductor laser, i.e., a semiconductor laser having a relatively long wavelength, as light source permits data equivalent to only about 40 minutes of motion pictures to be recorded on one DVD medium. Therefore, it is impossible to record or reproduce a relatively long program, e.g., a movie, on one disk. In addition, since the amount of information to be recorded/reproduced increases with the enhancement in the quality of images, a higher transfer rate may be required at the time of recording/reproduction. This calls for a great increase in the rotation speed of the disk.

SUMMARY OF THE INVENTION

The optical pickup of the present invention includes: a laser light source having an oscillating wavelength of 435 nm or less; an optical system providing light emitted from the laser light source with a prescribed optical path; and an optical detector for detecting light from the optical system, wherein the laser light source is provided with wavelength locking by optical feedback.

The laser light source may be a GaN type semiconductor laser.

The optical feedback of the laser light source may be provided by a grating structure.

In one embodiment, the laser light source is a semiconductor laser having a DBR structure, and the optical feedback thereof is provided by the DBR structure. The DBR structure may be formed in the vicinity of an end face opposite to a light emitting portion of the semiconductor laser. A member for absorbing laser light may be provided on an end face opposite to a light emitting portion of the semiconductor laser.

A tapered beam-shaping portion may be provided on the side of a light emitting portion of the laser light source.

The laser light source may be operated with RF superimposition.

According to another aspect of the present invention, the optical pickup includes: a laser light source; an optical system providing light emitted from the laser light source with a prescribed optical path; an optical detector for detecting light from the optical system; and a control member for controlling a light amount of an incident light onto the optical detector.

In one embodiment, the controlling member controls the light amount of the incident light onto the optical detector by controlling a polarization direction of the incident light.

Specifically, the controlling member may change a polarization direction of a laser light emitted from the laser light source, thereby controlling the polarization direction of the incident light onto the optical detector. For example, the laser light source may be a semiconductor laser, and the controlling member may apply pressure to the semiconductor laser, thereby changing the polarization direction of the laser light emitted from the semiconductor laser.

Alternatively, the controlling member may be a variable wavelength plate disposed between a polarizing optical element and a focus lens in the optical system.

The incident light onto the optical detector may be a signal light from an optical disk medium.

The optical disk apparatus according to the present invention includes: a laser light source having an oscillating wavelength of 435 nm or less; an optical system providing light emitted from the laser light source with a prescribed optical path; an optical detector for detecting light from the optical system; and an optical disk medium having pits with a length of 0.3 µm or less, wherein the laser light source is provided with wavelength locking by optical feedback.

The laser light source may be a GaN type semiconductor laser.

The optical feedback of the laser light source may be provided by a grating structure.

In one embodiment, the laser light source is a semiconductor laser having a DBR structure, and the optical feedback thereof is provided by the DBR structure. The DBR structure may be formed in the vicinity of an end face opposite to a light emitting portion of the semiconductor laser. A member for absorbing laser light may be provided on an end face opposite to a light emitting portion of the semiconductor laser.

A tapered beam-shaping portion may be provided on the side of a light emitting portion of the laser light source.

The laser light source may be operated with RF superimposition.

Preferably, the laser light source is a semiconductor laser having a level of a relative intensity of noise (RIN) of −135 dB/Hz or less.

The apparatus may perform optical recording onto the optical disk medium by using the light emitted from the laser light source.

According to another aspect of the present invention, the optical disk apparatus includes: a laser light source; an optical system providing light emitted from the laser light source with a prescribed optical path; an optical detector for detecting light from the optical system; an optical disk medium having pits with a length of 0.3 µm or less; and a control member for controlling a light amount of a signal light incident onto the optical detector from the optical disk medium.

In one embodiment, the controlling member controls the light amount of the signal by controlling a polarization direction of the signal light.

Specifically, the controlling member may change a polarization direction of a laser light emitted from the laser light source, thereby controlling the polarization direction of the signal light. For example, the laser light source may be a semiconductor laser, and the controlling member may apply pressure to the semiconductor laser, thereby changing the polarization direction of the laser light emitted from the semiconductor laser.

Alternatively, the controlling member may be a variable wavelength plate disposed between a polarizing optical element and a focus lens in the optical system.

Thus, the invention described herein makes possible the advantage of providing, in the implementation of an optical pickup and an optical disk apparatus utilizing a short-wavelength laser as a light source, a high-performance optical pickup capable of high-density recording/reproduction and an optical disk apparatus incorporating such an optical pickup.

The optical pickup according to the present invention, and the optical disk apparatus incorporating the same, utilize light having a relatively short wavelength, e.g., light of blue and other colors on the shorter end of the spectrum. As a result, it is possible to realize a high-performance, high definition DVD (HD-DVD) apparatus which is capable of recording/reproducing information in pits of an optical disk that are far more minute than those of an optical disk for a conventional DVD apparatus.

Furthermore, by performing wavelength locking of the semiconductor laser used as a light source, an optical pickup and an optical disk apparatus which are immune to returned light and capable of excellent recording/reproduction performance with a low noise level can be provided.

This and other advantages of the present invention will become apparent to those skilled in the art upon reading and understanding the following detailed description with reference to the accompanying figures.

BRIEF DESCRIPTION OF THE DRAWINGS

FIGS. 8A-1 to 8F-1 and FIGS. 8A-2 to 8F-2 are schematic diagrams illustrating manufacturing steps of a semiconductor laser employed in Example 1 of the invention.

FIGS. 14B, 14C, 14D-1, 14D-2, 14E-1, and 14E-2 are schematic diagrams illustrating a configuration and manufacturing steps of a II–VI group type semiconductor laser employed in Example 5 of the invention.

FIG. 15 is a schematic diagram illustrating a configuration of a molecular beam epitaxy apparatus used for the manufacture of the semiconductor laser shown in FIG. 13.

FIG. 16 is a schematic diagram illustrating a configuration of an optical pickup according to Example 5 of the invention.

DESCRIPTION OF THE PREFERRED EMBODIMENTS

Hereinafter, the experiments and studies conducted by the inventors which led to accomplishing the present invention will be described prior to the descriptions of specific examples of the invention.

An optical disk for the high-quality TV standard HDTV is required to have a recording capacity of at least about 10 GB or more even when the data is compressed at the maximum rate. This is because of the increased amount of information to be recorded corresponding to the increased number of pixels, which in turn is necessitated by the need for higher quality of images.

Figure 1:
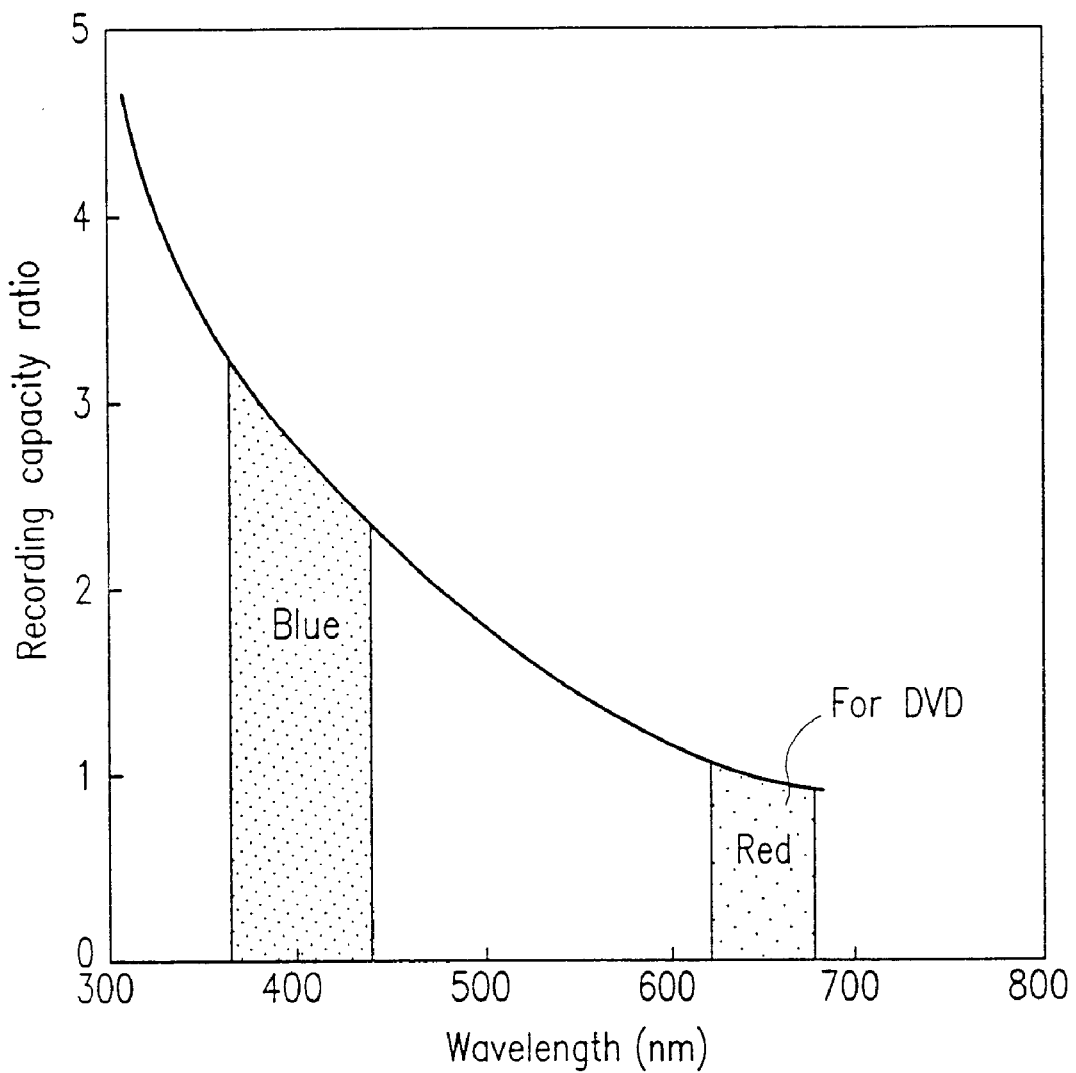
FIG. 1 is a graph illustrating the relationship between the wavelength of a light source and recording density.

FIG. 1 illustrates the relationship between the wavelength of a light source and the recording density (recording capacity) of an optical disk. Specifically, the change in the recording density (recording capacity) responsive to the change in the wavelength of the light source is described as a ratio (capacity ratio) based on the recording density (recording capacity) of a conventional DVD in the case of employing a red semiconductor laser (having a wavelength of about 650 nm) as a light source, which was defined as 1.

FIG. 1 shows that it would be technically possible to increase the recording density to about 2.2 times that of the current DVD or higher (e.g., 10 GB) by selecting a wavelength of 435 nm or lower.

The experiments and studies by the inventors also indicated that a semiconductor laser for use in such a HD (high definition)-DVD apparatus is required not only to be capable of generating a light beam with a small radius but also to have a RIN level which is equal to or lower than a predetermined level. This is because the sensitivity of a Si detector lowers in the blue region against the broad range of HDTV signals. Specifically, the inventors discovered through experiments and studies that the jitter must be reduced to less than 7%, which in turn requires a RIN level of −135 dB/Hz or less. The jitter will increase when the RIN level requirement is not met, thereby preventing sufficient signal reproduction.

Figure 2:
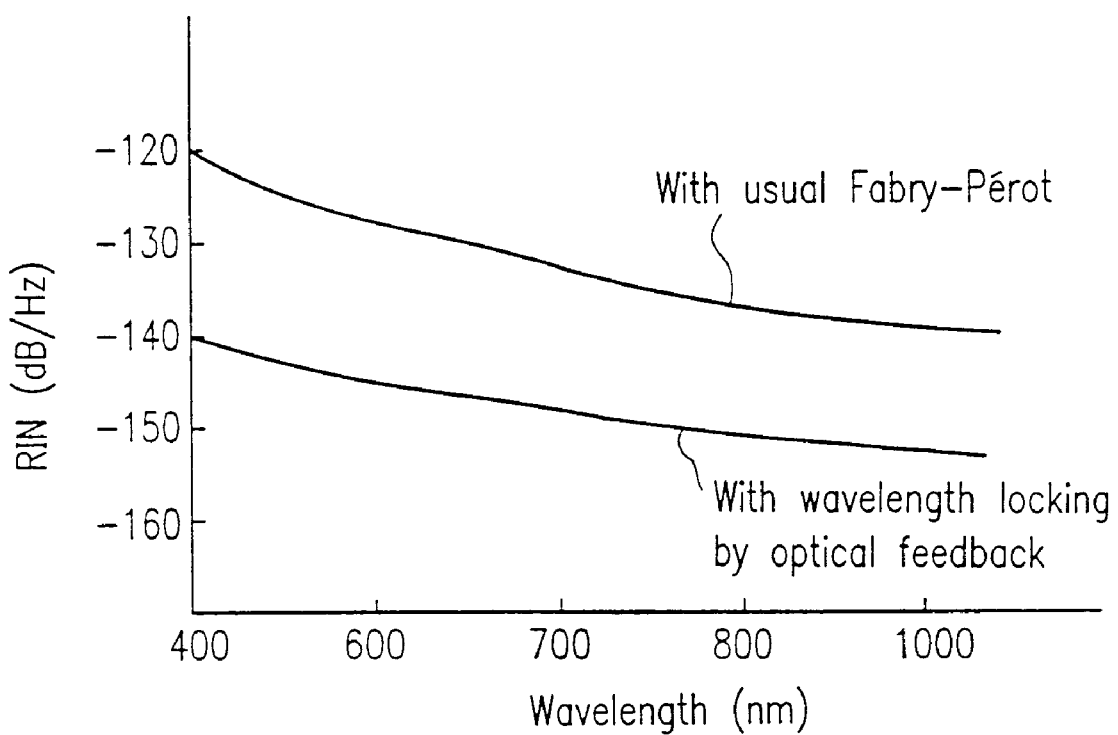
FIG. 2 is a graph illustrating the relationship between the wavelength of a semiconductor laser (a light source) and its RIN level.

FIG. 2 is a graph illustrating the relationship between the wavelength of a semiconductor laser and its typical RIN level, as obtained through experiments and studies by the inventors.

As seen from FIG. 2, the RIN level of a usual Fabry-Pérot semiconductor laser increases as the wavelength becomes smaller. For example, the RIN level at a light source wavelength of 400 nm is about −120 dB/Hz, far from meeting the above-mentioned RIN level requirement.

Thus, the experiments and studies by the inventors have shown that achieving high-density recording for an optical disk apparatus such as a DVD apparatus requires more than selecting a short-wavelength semiconductor laser as a light source in order to attain recording/reproduction at a sufficiently high quality.

Therefore, the present invention not only employs a short-wavelength semiconductor laser as a light source but also achieves wavelength locking of the short-wavelength semiconductor laser by optical feedback, thereby attaining a low noise level, as shown in FIG. 2. Specifically, a RIN level of about −140 dB/Hz is attained by the present invention, which is significantly lower than the above-mentioned RIN level requirement. Such low noise is a result of stabilizing the longitudinal mode by optical feedback, thereby reducing the generation of mode hop noise and/or mode competitive noise.

Furthermore, the present inventors have confirmed that the wavelength locking by optical feedback also provides other advantages as set forth below.

An optical lens typically employed as an element constituting a convergence lens in a conventional configuration is susceptible to a shift in the focal point between a recording operation and a reproduction operation. This is due to the change in refractive index that is experienced by the light, which in turn is due to the slight change in the wavelength of the light source. Such shift in the focal point is about 0.4 $\mu$m in the recording/reproduction in the red wavelength region and therefore is negligible in practice use. However, the experiments and studies of the inventors revealed that since the refractive index of glass has a larger wavelength dependency in the blue wavelength region, the focal point greatly shifts when switching operation from recording to reproduction, thereby preventing sufficient recording/reproduction in the blue wavelength region.

Figure 3:
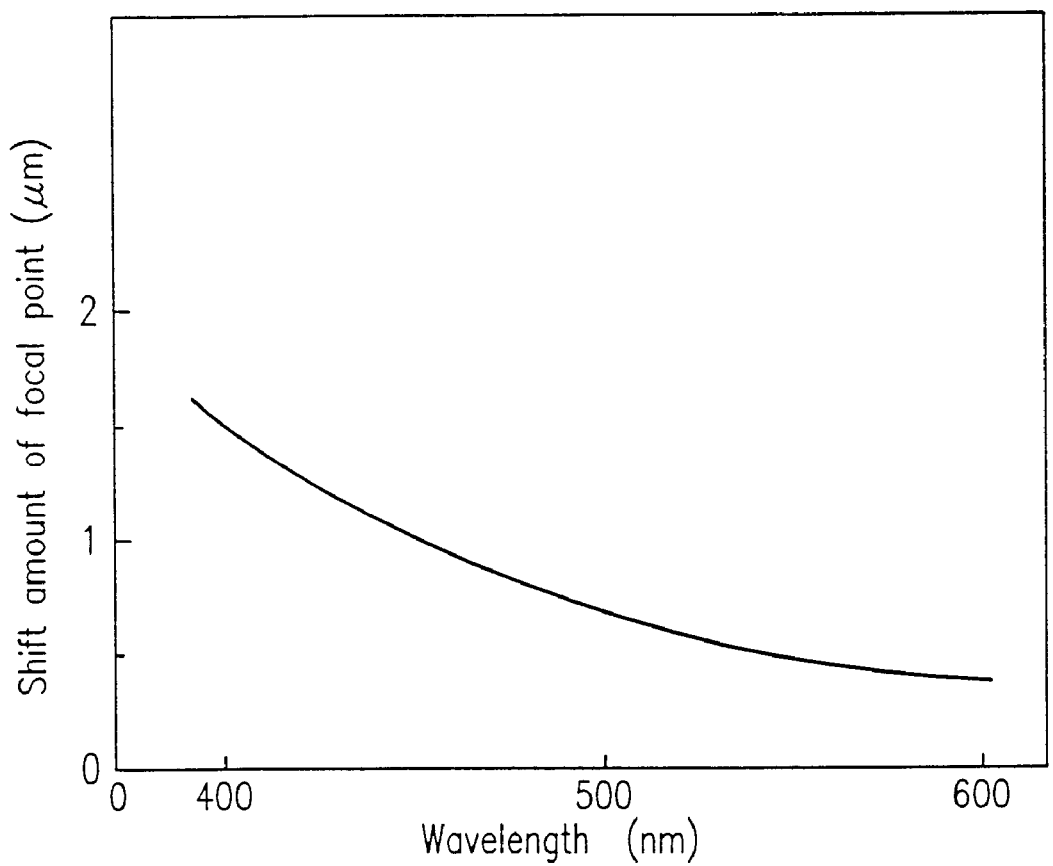
FIG. 3 is a graph illustrating the shift amount of the focal point across the wavelengths of the light source responsive to a change in the light source wavelength of 2 nm between recording and reproduction.

The above point will be explained with respect to an exemplary optical lens BaCD6 (manufactured by HOYA Corporation), which is a common choice in the field. FIG. 3 is a graph illustrating the shift amount of the focal point across the wavelengths of the light source responsive to a change in the light source wavelength of 2 nm between recording and reproduction, obtained by the present inventors. As shown by the graph, the refractive index (i.e., amount of change in the focal point) has small wavelength dependency in the red wavelength region such that only a 0.4 $\mu$m shift of the focal point results responsive to the 2 nm shift in the light source wavelength, as stated above.

On the other hand, in the blue wavelength region, the refractive index (i.e., amount of change in the focal point) has large wavelength dependency, so that a substantially threefold shift in the focal point results, i.e., 1.2 $\mu$m. Thus, the desired signal reproduction operation becomes difficult to attain.

The experiments and studies of the inventors revealed a similar phenomenon in other glass materials which are commonly employed for a convergence lens in the red wavelength region. Thus, it has been confirmed that the optical glass materials typical for the red wavelength region may not be appropriate choices for the blue wavelength region as they are.

On the other hand, according to the present invention, a short-wavelength semiconductor laser is wavelength locked by optical feedback, thereby reducing the variation of the oscillation wavelength of the semiconductor laser used as the light source to a lower level. Thus, it has been confirmed that, according to the present invention, a typical conventional optical glass material for the red wavelength region, refractive index of which has large wavelength dependency, can also be employed for the blue wavelength region while reducing the shift amount in the focal point responsive to changes in the refractive index because the shift in the light source wavelength is in itself minimized.

Hereinafter, several examples of the present invention achieved through the above discussion will be described with reference to the accompanying figures.

EXAMPLE 1

An optical pickup and an optical disk apparatus 100 according to Example 1 of the present invention will be described with reference to FIG. 4.

The optical disk apparatus 100 at least includes a semiconductor laser 50, an optical system including a lens, an optical disk medium 55, and an optical detector 57. A GaN type semiconductor laser 50 is used as a semiconductor laser 50. The semiconductor laser 50 has a DBR (distributed Bragg reflector) structure with grating formed in its interior, and is subject to optical feedback for wavelength locking.

The semiconductor laser has an oscillation wavelength of 420 nm for 2.4 times density as compared with that of conventional DVDs. Thus, the optical disk apparatus is capable of reproducing HDTV at a transfer rate of 12 Mpbs from 11.5 GB of information recorded on an optical disk medium (having a 12 cm diameter), Next, the operation of the optical pickup and the optical disk apparatus 100 is described.

Laser light emitted from the GaN semiconductor laser 50 is collimated through a collimation lens 51, led through a polarization beam splitter 58 and a ¼ wavelength plate 59, and converged by a focus lens 52 so as to be radiated on pits 56 formed in an optical disk medium 55. The signal light from the optical disk medium 55 is collimated by the focus lens 52, and has its polarization direction turned by the ¼ wavelength plate 59 by 90° relative to its polarization direction before being returned from the optical disk medium 55. As a result, the signal light is reflected from the polarization beam splitter 58 so as to be converged on the optical detector 57 by the focus lens 53. The focus lens 52 for converging light onto the optical disk medium 55 has a numerical aperture (NA) of 0.6. The pits 56 formed in the optical disk medium 55 have a length of 0.26 $\mu$m and a track pitch of 0.49 $\mu$m.

While an optical pickup incorporating a red semiconductor laser can only read pits that are 0.4 $\mu$m long or more, the optical pickup according to the present invention can read pits 56 that are 0.26 $\mu$m long. The experiments by the present inventors have shown that excellent HDTV images free of noise can be reproduced. This is in stark contrast with a conventional Fabry-Pérot type semiconductor laser which is not wavelength locked; an optical pickup incorporating such a laser is incapable of signal reproduction due to its high noise level.

Figure 5:
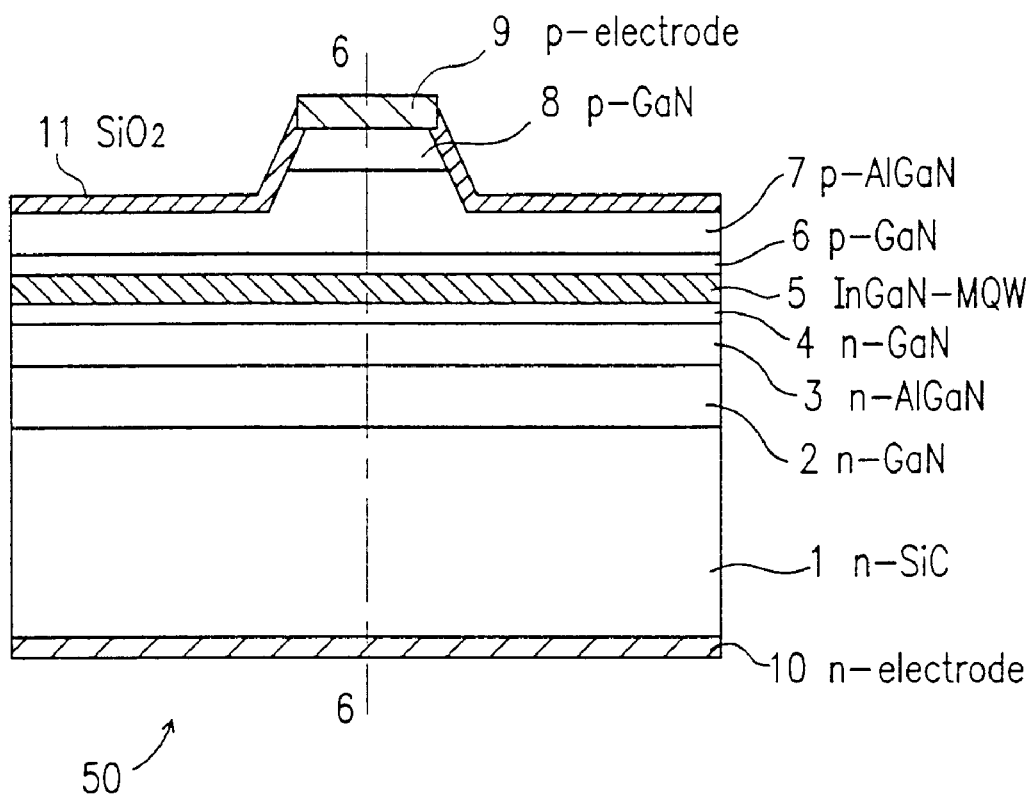
FIG. 5 is a cross-sectional view illustrating a configuration of a GaN type semiconductor laser employed in Example 1 of the invention.
Figure 6:
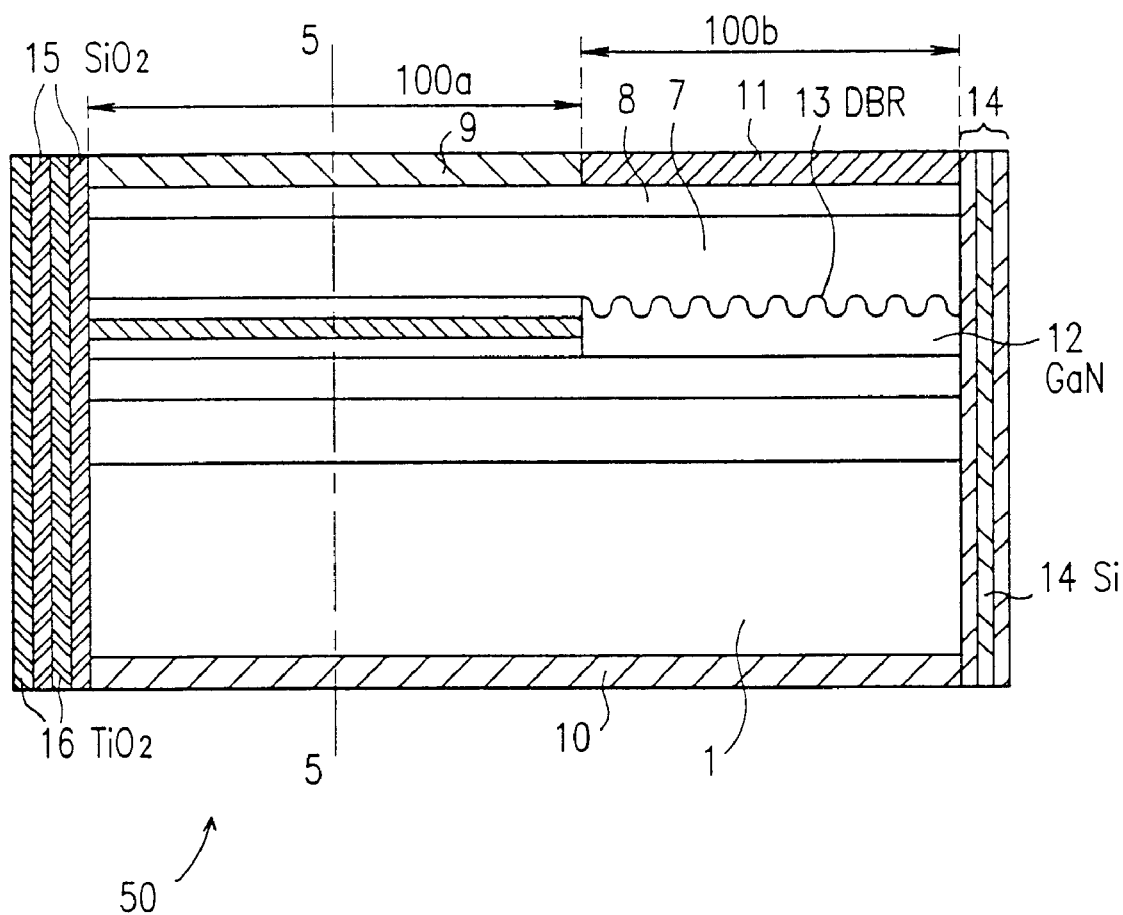
FIG. 6 is a cross-sectional view illustrating a configuration of a GaN type semiconductor laser employed in Example 1 of the invention.
Figure 7:
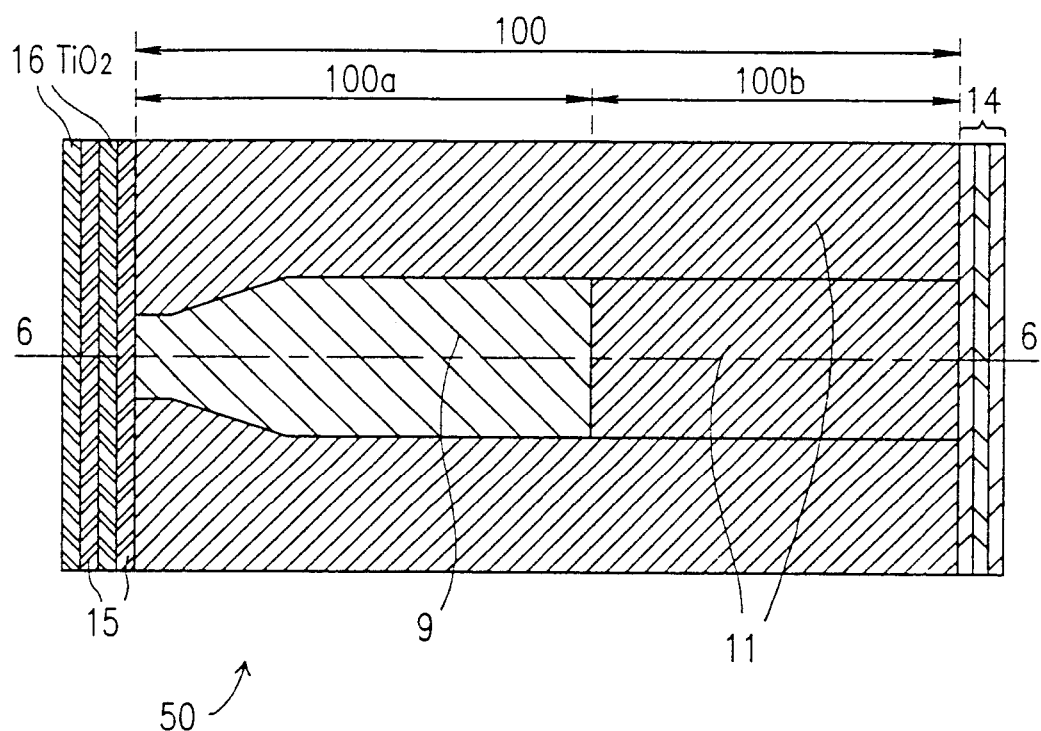
FIG. 7 is a plan view illustrating a configuration of a GaN type semiconductor laser employed in Example 1 of the invention.

FIG. 5 is a cross-sectional view of the semiconductor laser 50 taken at line 5—5 in FIG. 6 (the cross section being parallel to the cavity end faces). FIG. 6 is a cross-sectional view of the semiconductor laser 50 taken at line 6—6 in FIGS. 5 and 7 (the cross section being parallel to the cavity length direction). FIG. 7 is a plan view of the semiconductor laser 50.

A substrate 1 is an n-SiC substrate. SiC is a suitable material for the substrate 1 of the GaN type semiconductor laser 50 because it has a similar lattice constant to those of GaN and AlGaN (lattice constant difference: about 3.4%) and allows formation of oscillation end faces through cleavage, with appropriate electrical conductivity and good thermal conduction.

Sapphire (lattice constant difference: about 13.8%), which has a large difference in lattice constant from GaN or AlGaN, is also frequently employed as the material for the substrate 1 of the GaN type semiconductor laser 50. However, since sapphire has poor electrical conductivity, an n-electrode 10 (see FIG. 5) must be provided on an n-GaN layer 2 (see FIG. 5), as shown in FIG. 9.

Figure 9:
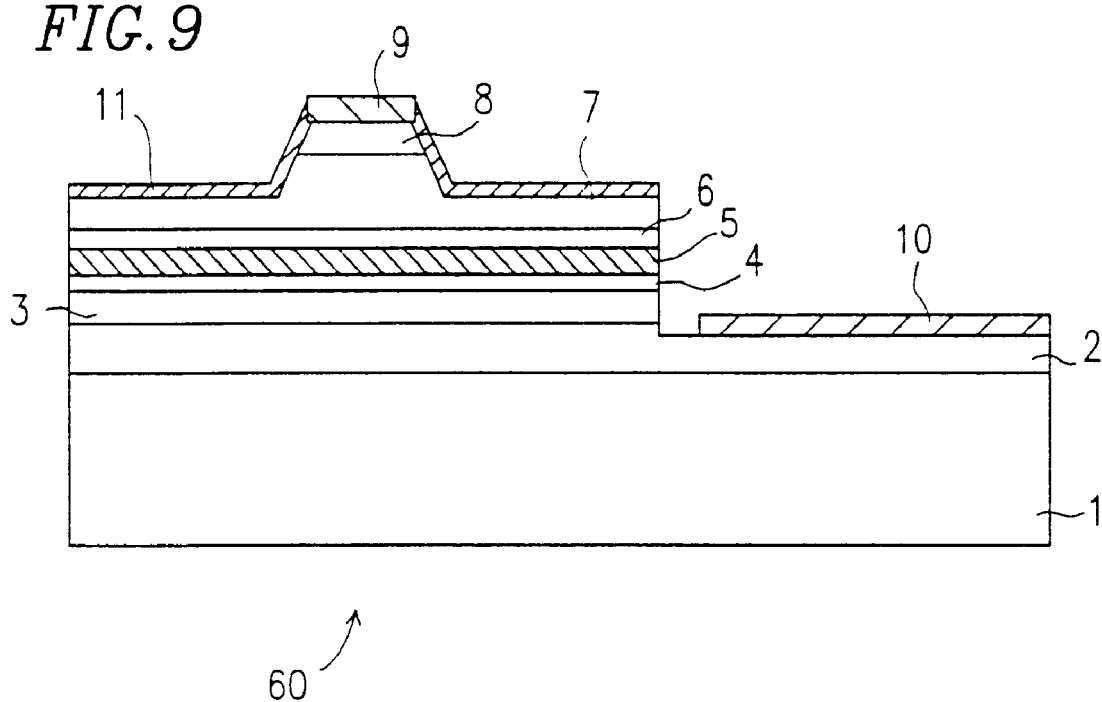
FIG. 9 is a cross-sectional view illustrating another configuration of a GaN type semiconductor laser employed in Example 1 of the invention.

FIG. 9 is a cross-sectional view of a semiconductor laser 60 incorporating such a sapphire substrate, the cross section taken in parallel to the cavity end faces. In FIG. 9, the constituent elements which also appear in the semiconductor laser 50 illustrated in FIGS. 5 to 7 are indicated by the same reference numerals as used therein, with their descriptions omitted.

Other materials for the substrate 1 include Si, GaAs, ZnO, $LiAlO_2$, $LiGaO_2$, $MgAl_2O_4$, and the like. A p-type substrate can be employed instead of an n-type substrate. It will be appreciated that, when using a p-type substrate, the conductivity types (i.e., p or n) of the respective layers in the multilayer structure formed on such a substrate must be reversed from their exemplary conductivity types in the following description.

As shown in FIG. 5, on an n-SiC substrate 1, the following layers are formed in this order:

an n-GaN layer 2 (Si doped, having a carrier density of $1 \times 10^{18}$ cm$^{-3}$ and a thickness of 3 μm);

an n-AlGaN cladding layer 3 (Al content 10%, Si doped, having a carrier density of $1 \times 10^{18}$ cm$^{-3}$ and a thickness of 0.5 μm);

an n-GaN optical waveguide layer 4 (Si doped, having a carrier density of $1 \times 10^{18}$ cm$^{-3}$ and a thickness of 0.1 μm);

an InGaN multiple quantum well (MQW) layer 5 (including 7 alternating layers of 4 nm thick $In_{0.02}Ga_{0.98}N$ barrier layers and 3 nm thick $In_{0.15}Ga_{0.85}N$ well layers;

a p-GaN optical waveguide layer 6 (Mg doped, having a carrier density of $1 \times 10^{18}$ cm$^{-3}$ and a thickness of 0.1 μm);

a p-AlGaN cladding layer 7 (Al content 10%, Mg doped, having a carrier density of $1 \times 10^{18}$ cm$^{-3}$ and a thickness of 0.5 μm); and a p-GaN layer 8 (Mg doped, having a carrier density of $1 \times 10^{19}$ cm$^{-3}$ and a thickness of 0.3 μm).

A buffer layer (not shown) is provided at the interface between the substrate 1 and the n-GaN layer 2. An AlN layer (thickness: 20 nm) is employed as the buffer layer in the case where the substrate 1 is a SiC substrate, and a GaN layer (thickness: 30 nm) in the case where the substrate 1 is a sapphire substrate, thereby minimizing the lattice constant difference between the n-GaN layer 2 and the substrate 1 so as to obtain an excellent crystal with a low defect density.

A mesa ridge is formed from the upper face of the p-GaN layer 8 to about the middle of the p-AlGaN layer 7. The width of the mesa ridge varies along the cavity length direction as shown in FIG. 7, thereby forming a tapered beam shaping portion. In the narrowest portion (the left end in FIG. 7) of the mesa ridge adjoining the cavity end face, the bottom width of the mesa ridge is 2 μm, and it gradually increases into the interior of the crystal (oscillator) to a maximum value of 5 μm. As a result, the horizontal spread angle of the laser light emitted from the end face (adjoining the narrow portion of the mesa ridge) becomes relatively broad (about 20°), so that a laser beam which is substantially circular with respect to the vertical spread angle (about 23°) is obtained.

With reference to FIG. 6, the cavity length of the semiconductor laser 100 is typically 1 mm. In a region 100a which accounts for 0.6 mm, an MQW active layer 5 is provided. Neither the active layer 5 nor the upper and lower optical waveguide layers 4 and 6 are formed in the remaining region 100b; instead, a GaN layer 12 including a diffraction grating (distributed Bragg reflector: DBR) 13 with a period of 158 nm is provided in the region 100b.

The GaN layer 12 does not absorb laser light with a wavelength of 410 nm, and the semiconductor laser 50 oscillates in a single longitudinal mode with the oscillation spectrum selected by the DBR 13. A Si film 14 (thickness: 500 nm) is provided on the end face adjacent the DBR 13 so as to absorb the light component (accounting for about 10%) that was not reflected by the DBR 13, thereby preventing the Fabry-Pérot cavity mode. On the other hand, four layers of alternating $SiO_2$ films 15 (thickness: 71 nm) and $TiO_2$ films 16 (thickness: 47 nm) are provided on the end face adjacent the MQW so as to increase the reflectance to 76%. As a result, instability in the laser spectrum due to returned light can be prevented, whereby low noise characteristics can be realized.

Figures 1, 8A:
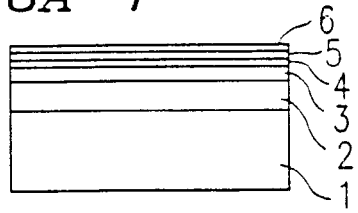
Figures 2, 8A:
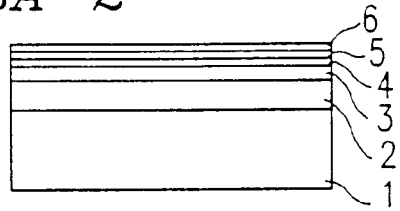
Figures 1, 8B:
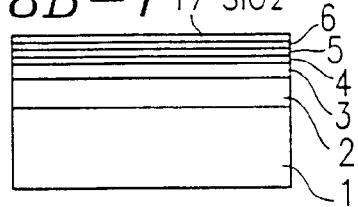
Figures 2, 8B:
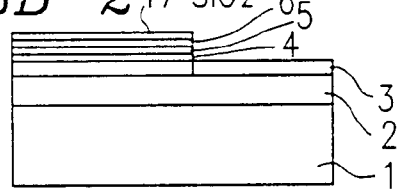
Figures 1, 8C:
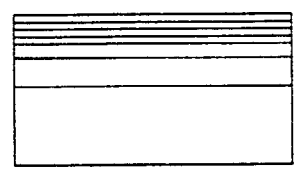
Figures 2, 8C:
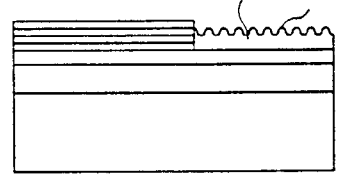
Figures 1, 8D:
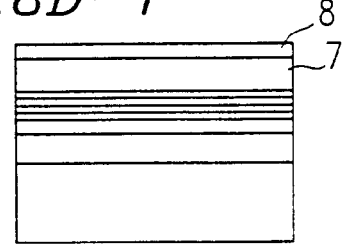
Figures 2, 8D:
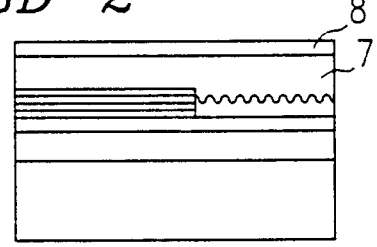
Figures 1, 8E:
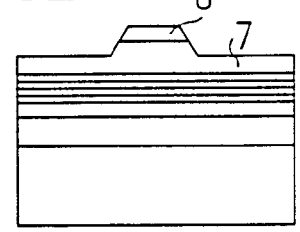
Figures 2, 8E:
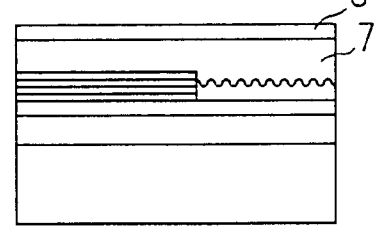
Figures 2, 8F:
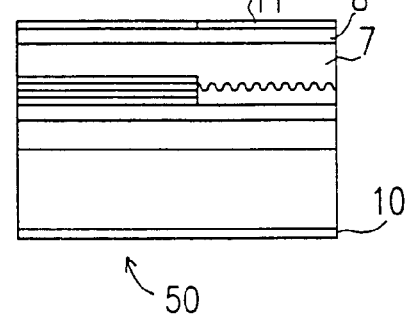

FIGS. 8A-1 to 8F-1 and FIGS. 8A-2 to 8F-2 illustrate the manufacturing steps of the semiconductor laser 50 according to the present invention. FIGS. 8A-1 to 8F-1 are cross-sectional views in parallel with the cavity end faces of the semiconductor laser 50; FIGS. 8A-2 to 8F-2 are cross-sectional views along the cavity length direction of the semiconductor laser 50.

First, the respective layers from the n-GaN layer 2 to the p-GaN layer 6 are formed on the n-SiC substrate 1 by MOVPE (metal organic vapor phase epitaxy), with an AlN buffer layer (not shown) interposed therebetween (FIGS. 8A-1 to 8A-2). During the growth process, TMG, TMI, TMA, and $NH_3$ are used as a Ga source, an In source, an Al source, and a N source, respectively; and $H_2$ or $N_2$ is used as a carrier gas to thermally decompose each material gas at a high temperature in the range of about 800° C. to about 1100° C. thereby growing the respective layers on the substrate. In addition, $SiH_4$ or $Cp_2Mg$ is flowed to impart the layers with the p-type conductivity or the n-type conductivity.

Next, after the $SiO_2$ layer 17 is deposited by CVD (chemical vapor deposition), a mask pattern is formed by photolithography and etching, and the p-GaN layers 6 to the n-GaN layer 4 are processed so as to leave predetermined patterns (FIGS. 8B-1 and 8B-2). In the case where milling technique is employed, a mask pattern of a resist layer is employed instead of the $SiO_2$ layer 17.

Next, the GaN layer 12 is grown by again using MOVPE. It should be noted that the GaN layer 12 does not grow in portions covered with the $SiO_2$ layer 17. Since the GaN layer 12 is not doped with any impurities, the GaN layer 12 acquires high resistance so as to ensure that a current does not flow in the DBR region. After the crystal growth, a diffraction grating 13 (with a pitch of 158 nm) is formed on the GaN layer 12 by laser light interference exposition and etching (FIGS. 8C-1 and 8C-2).

After removing the SiO$_2$ layer 17, the p-type layers 7 and 8 are grown by using MOVPE (FIGS. 8D-1 and to 8D-2). Next, a mesa ridge is formed from the upper face of the layer 8 to about the middle of the layer 7 by photolithography and etching (FIGS. 8E-1 and 8E-2).

Furthermore, Ni/Au is deposited on the mesa ridge so as to form the p-electrode 9, and Ti/Au is deposited on the lower face of the substrate 1 so as to form the n-electrode 10. As a result, the semiconductor laser 50 is formed.

Figure 10A:
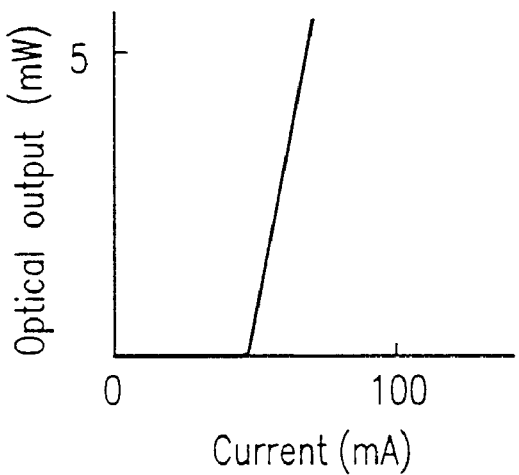
FIGS. 10A to 10C are graphs illustrating the operational characteristics of a GaN semiconductor laser employed in Example 1 of the invention.
Figure 10B:
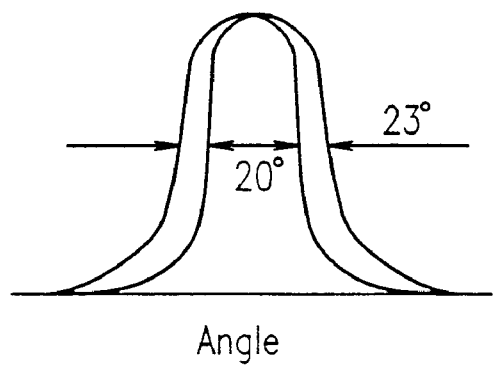
Figure 10C:
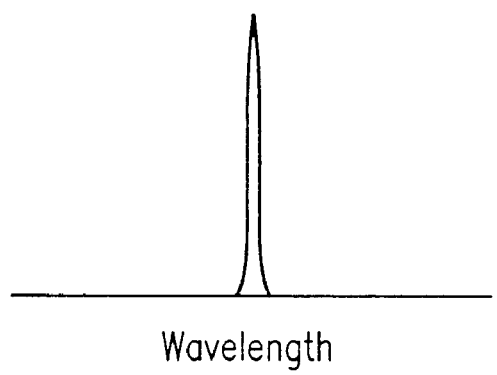

FIGS. 10A to 10C show the operational characteristics of the semiconductor laser 50. Specifically, FIG. 10A shows the current-optical output characteristics; FIG. 10B shows the beam spreading distribution; and FIG. 10C shows the oscillation spectrum.

It will be seen from these figures that the semiconductor laser 50 has a threshold current of 45 mA with a beam aspect ratio (defined as the vertical spread angle/the horizontal spread angle) of 1.15, indicative of a single longitudinal mode oscillation. Since the aspect ratio is very close to 1, light can be radiated at an efficiency of 40% from a laser with an output level of 2 mW onto the surface of an optical disk medium, without even using a beam shaping element. As a result, the size and cost of the optical pickup can be minimized. Since the reflectance at the front end face of the cavity is increased while ensuring that the unreflected light at the rear end face of the cavity is absorbed, the laser can stably operate with low noise even under the condition of the 4% returned light.

As described above, the optical pickup according to Example 1 of the present invention is capable of reproducing/recording data in pits provided at higher densities than conventional pit densities. As a result, an optical disk apparatus capable of high-density reproduction/recording is realized. By employing a DBR semiconductor laser as the light source semiconductor laser 50, the noise level can be reduced to a RIN level of about −140 dB/Hz.

By forming a tapered portion at the outgoing end face of the semiconductor laser 50 so as to bring the beam aspect ratio to the proximity of 1, the effective transmission ratio can be greatly improved. As a result, a low-output laser can be used as the semiconductor laser 50, thereby providing the device with a prolonged lifetime. Specifically, the conventional art techniques employ a 5 mW semiconductor laser, for example, with the peripheral portions of the emitted beam being cut off. In contrast, the present example requires the semiconductor laser 50 to have an output power of only 2 mW, implying a threefold increase in lifetime.

According to the present example, an absorption film is provided on the rear end face of the DBR semiconductor laser 50 to prevent the occurrence of returned light. Alternatively, an absorption layer can be provided in the vicinity of the rear end face of the cavity (e.g., an upper portion in the figure).

While the semiconductor laser 50 in the above example has an oscillation wavelength of about 420 nm, an oscillation at 380 nm is possible with a different composition of the material of the semiconductor laser 50. A resultant optical disk apparatus would provide for a recording density 2.9 times as compared with that of a conventional red DVD, resulting in a disk capacity of about 13.8 GB. A disk capacity of about 20 GB becomes possible by further increasing the NA of the lens to 0.7. In such cases, a 2 hour HDTV program can be recorded/reproduced on a single disk at a transfer rate of 20 Mbps. A disk capacity of about 40 GB can be provided by a disk with a two layer structure.

It is also applicable to induce optical feedback in the semiconductor laser 50 by employing a DFB (distributed feedback) structure, instead of a DBR structure as set forth above. However, a DBR laser is more preferable than a DFB laser in terms of production yield.

According to the present example, the oscillation wavelength of the semiconductor laser 50 has a very small variation owing to the locking of the oscillation wavelength due to optical feedback. This substantially eliminates the constraints on the lens material (optical glass) due to wavelength variation. As a result, it becomes possible to employ high refractive index materials such as fluorine type glass material, thereby facilitating the realization of a lens having a high NA value. Furthermore, the oscillation wavelength locking configuration of the present example also makes it possible to employ a diffraction type lens, etc., which was not available to the conventional art techniques because of the variation in the focal point responsive to variation in the oscillation wavelength.

EXAMPLE 2

Next, an embodiment will be described where recording is performed for an optical disk medium by employing an optical pickup incorporating the semiconductor laser according to the present invention as a light source.

The fundamental structure of the optical pickup of the present example is similar to that described in Example 1. Specifically, a GaN type semiconductor laser having an oscillation wavelength of 400 nm and a beam aspect ratio of 1.5 is employed. However, in the present example, optical feedback is attained by means of an external grating.

The present example also attains an aspect ratio which is very close to 1. As a result, light can be radiated at a 40% efficiency from a 2 mW laser onto the surface of an optical disk medium, without even using a beam shaping element. As a result, excellent recording can be performed on the surface of an optical disk medium with a recording power of about 8 mW. In contrast, an optical pickup incorporating a conventional semiconductor laser having an aspect ratio of 3 would only provide a light utility efficiency of 20%, so that a laser output of about 40 mW would be required to achieve a similar recording performance; this would reduce the lifetime of the apparatus and therefore is impractical.

Moreover, according to the present example, RF superimposition at 600 MHz is performed for the semiconductor laser. Although this brings down the RIN level to about −137 dB/MHz, it also provides for increased tolerance against returned light. Such an RF superimposition technique is effective because it neither diversifies the oscillation mode nor substantially degrades the noise characteristics.

In accordance with the optical disk apparatus of the present example, 12.5 GB of data can be recorded on an optical disk medium.

Also according to the present example, the oscillation wavelength of the semiconductor laser 50 has a very small variation owing to the locking of the oscillation wavelength due to optical feedback. This substantially eliminates the constraints on the lens material (optical glass) due to wavelength variation. It also becomes possible to employ a diffraction type lens, etc., which was not available to the conventional art techniques because of the variation in the focal point responsive to variation in the oscillation wavelength.

EXAMPLE 3

Polycarbonate is generally employed as a protection layer on an optical disk medium due to its low cost and high reliability. However, the birefringence of polycarbonate induces wavelength dispersion. In this connection, the present inventors performed experiments and studies to discover that the birefringence or wavelength dispersion of polycarbonate induce substantial problems in the blue wavelength region.

Specifically, a polycarbonate protection layer on an optical disk medium may act in a similar manner to a ¼ wavelength plate, especially in the wavelength region of 435 nm or below. It has been confirmed that the magnitude of such an action varies from the inner periphery to the outer periphery of the optical disk medium and becomes particularly problematic in the case of employing a polarization beam splitter or a polarization hologram device.

The aforementioned problems were not recognized under the conventional art.

Figure 4:
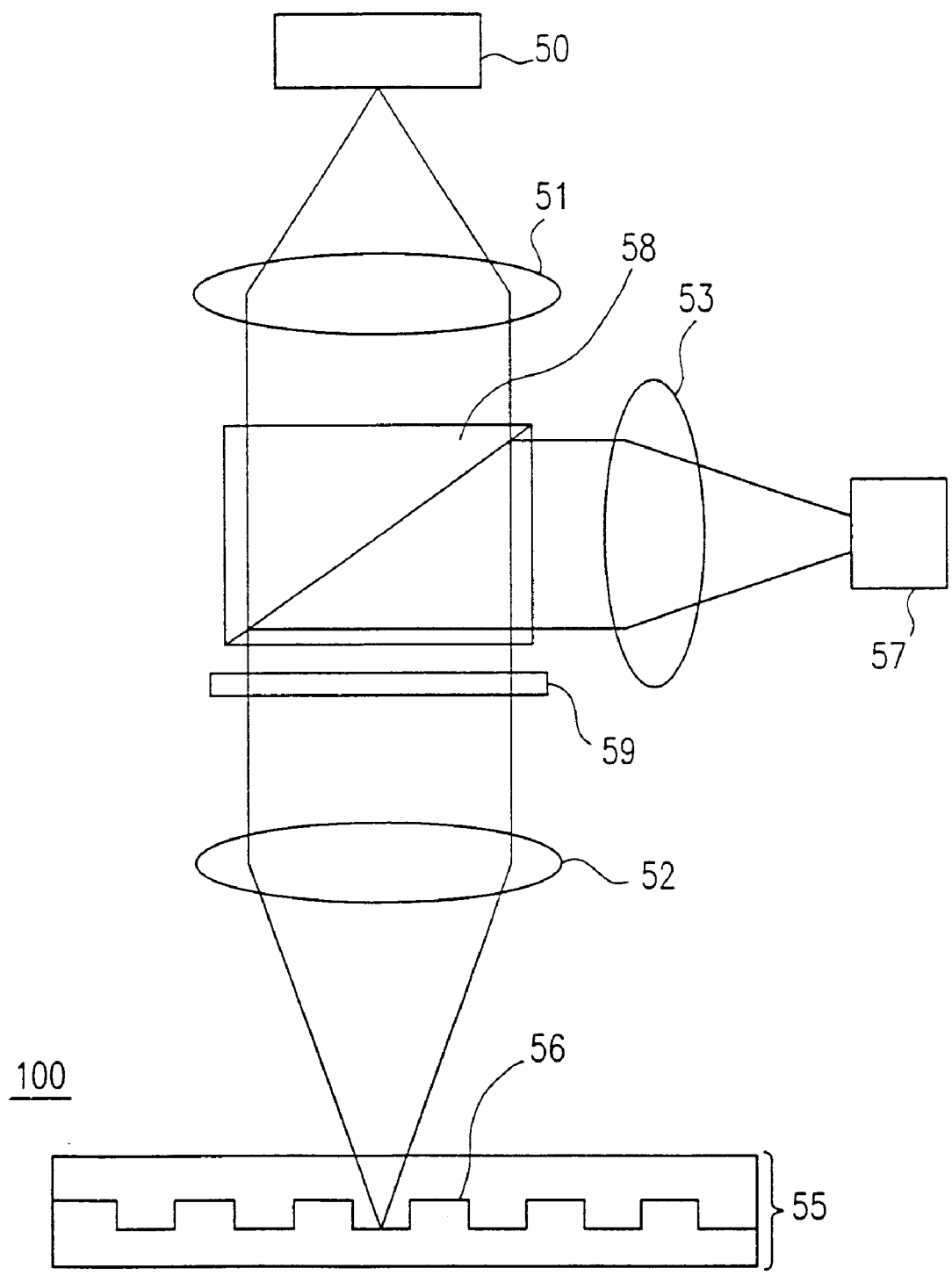
FIG. 4 is a schematic diagram illustrating a configuration of an optical pickup and an optical disk apparatus according to Example 1 of the present invention.

In order to overcome the aforementioned problems, the present example controls polarization of a laser light emitted from a semiconductor laser 70 (corresponding to the semiconductor laser 50 in Example 1) in an optical pickup structure essentially similar to that shown in FIG. 4.

Figure 11:
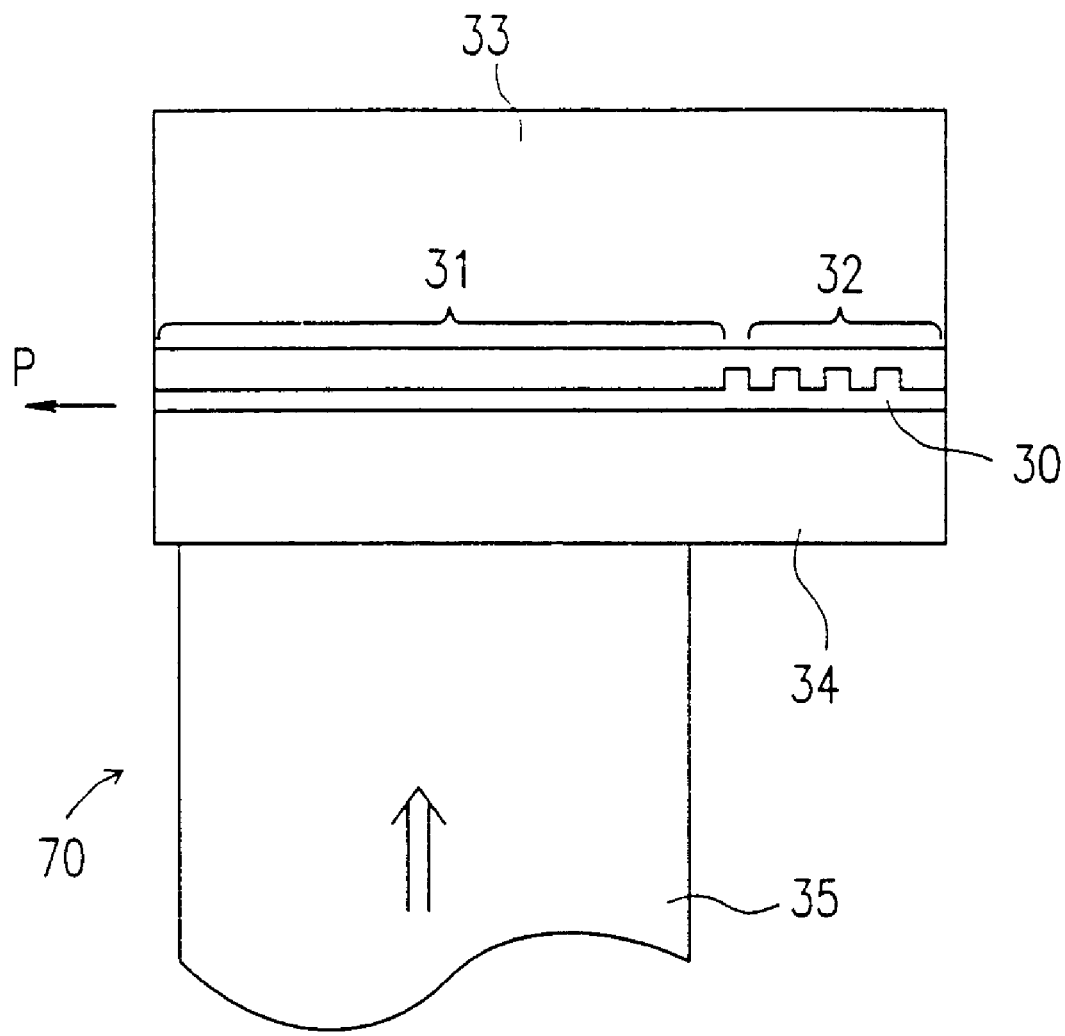
FIG. 11 is a cross-sectional view illustrating a configuration of a GaN type semiconductor laser employed in Example 3 of the invention.

FIG. 11 is a schematic cross-sectional view illustrating a configuration of the semiconductor laser 70 (GaN type semiconductor laser) employed in the present example.

In an active layer 30 of a GaN laser chip 34 in the illustrative structure, a DBR structure is formed (defining a DBR section 32) in the vicinity of end face of the laser chip 34 opposite the end face from which laser light P goes out. The remaining portion of the active layer 30 defines an active section 31. Furthermore, after being bonded to a Si mount 33, a pressure is applied to the semiconductor laser chip 34 on the side of the active section 31 via its substrate (not shown) or opposite the Si mount 33. By varying the applied pressure, the polarization direction of the laser light P from the semiconductor laser chip 34 is rotated. In the present example, a piezo element 35 is used for the application of pressure.

With a pressure of 400 g/cm$^2$ applied to the semiconductor laser chip 34 in the above structure, the polarization direction of the laser light P from the semiconductor laser chip 34 is rotated by about 60°. By thus controlling the polarization of the laser light P, it becomes possible to maintain substantially a constant amount of signal light being reflected from an optical disk medium and entering an optical detector. Specifically, the light amount of the signal light is monitored, and the monitoring results are fed back to the voltage applied to the piezo element 35 so as to vary the polarization direction of the laser light P. Consequently, the amount of incident signal light is kept constant.

The apparatus according to the present example realizes excellent reproduction operation. Without performing such control for the signal light, the incident light amount would decrease, thereby making it difficult to correctly reproduce signals from the optical disk medium.

It is preferable to restrain the application of pressure onto the semiconductor laser chip 34 (with the piezo element 35, etc.) within the vicinity of the active section 31 because any pressure applied on the DBR section 32 might induce undesirable wavelength variation.

Instead of the piezo element 35, a torque motor or the like may also be used for the application of pressure.

EXAMPLE 4

In the present example, the birefringence problem of the optical disk medium as set forth in Example 3 is addressed by employing a variable wavelength plate 61 interposed between the focus lens 52 and the polarization beam splitter 58, instead of applying a pressure onto the semiconductor laser chip.

Figure 12:
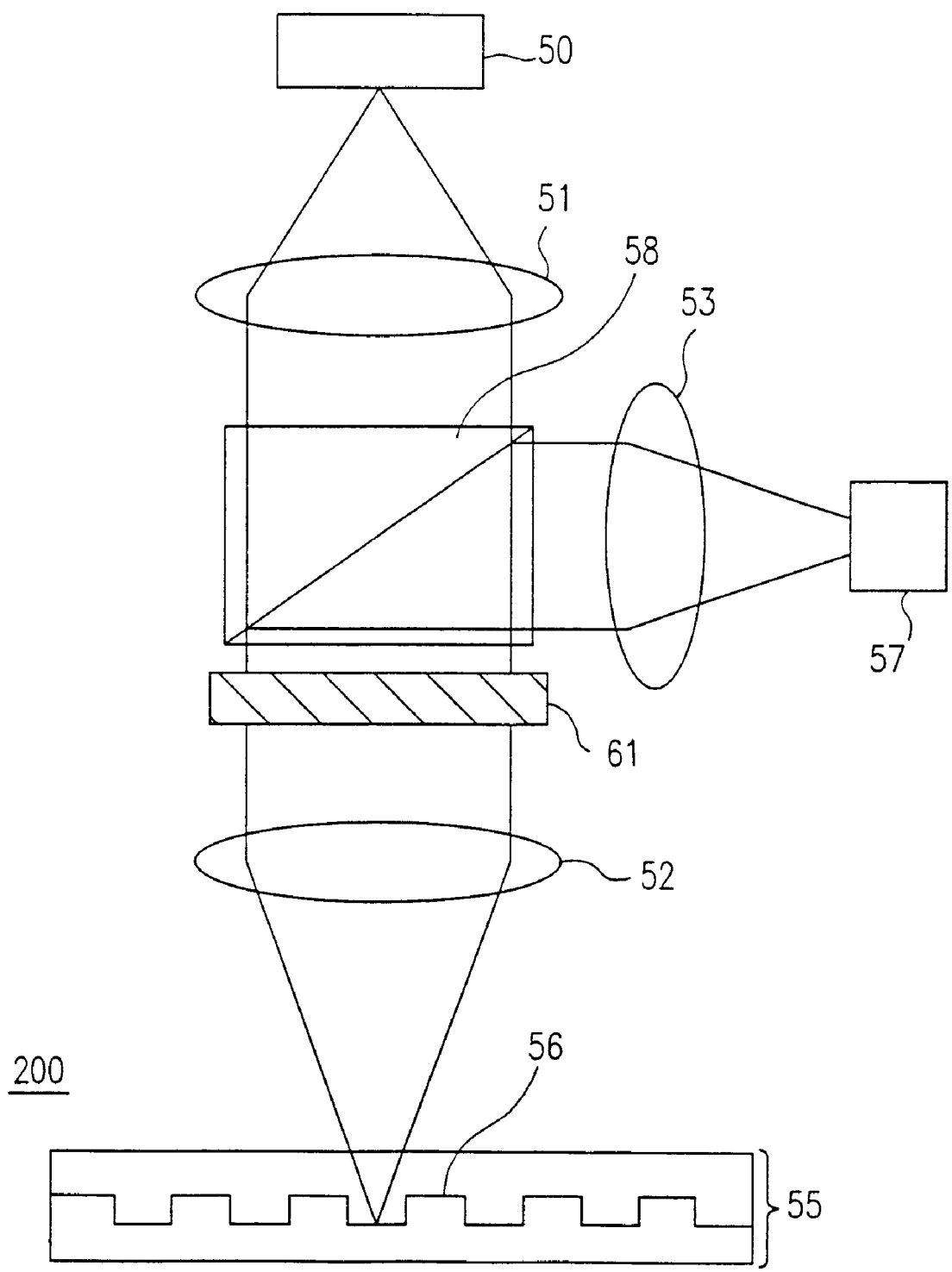
FIG. 12 is a schematic diagram illustrating a configuration of an optical pickup and an optical disk apparatus according to Example 4 of the present invention.

FIG. 12 is a schematic diagram illustrating a configuration of an optical pickup and an optical disk apparatus 200 according to the present example.

The laser light emitted from the GaN semiconductor laser 50 is collimated through a collimation lens 51, led through a polarization beam splitter 58 and the variable wavelength plate 61, and converged by a focus lens 52 so as to be radiated on pits 56 formed in an optical disk medium 55. The signal light from the optical disk medium 55 is collimated by the focus lens 52, led through the variable wavelength plate 61, and reflected from the polarization beam splitter 58 so as to be converged on the optical detector 57 by the focus lens 53.

As the variable wavelength plate 61, a LiNbO$_3$ plate is employed, a refractive index of which in a particular direction can be varied by an applied voltage through electro-optical effects. By applying an electric field over the entire surface of the variable wavelength plate (the LiNbO$_3$ plate) 61, its birefringence difference is controlled so that the variable wavelength plate 61 has a variable function ranging from that of a 0 wavelength plate to a ¼ wavelength plate. As a result, the amount of signal light entering the optical detector 57 is always maintained at the maximum level when reproducing data both from the inner periphery and the outer periphery of the optical disk medium. By thus inserting a variable wavelength plate 61 between the focus lens 52 and the polarization element (polarization beam splitter) 58, polarization is controlled so as to substantially fix the amount of signal light entering the optical detector 57 at the maximum level.

EXAMPLE 5

In the present example, a semiconductor laser for an optical pickup is constructed by using a II–VI group material, which provides an oscillation wavelength of 435 nm or below.

Figure 13:
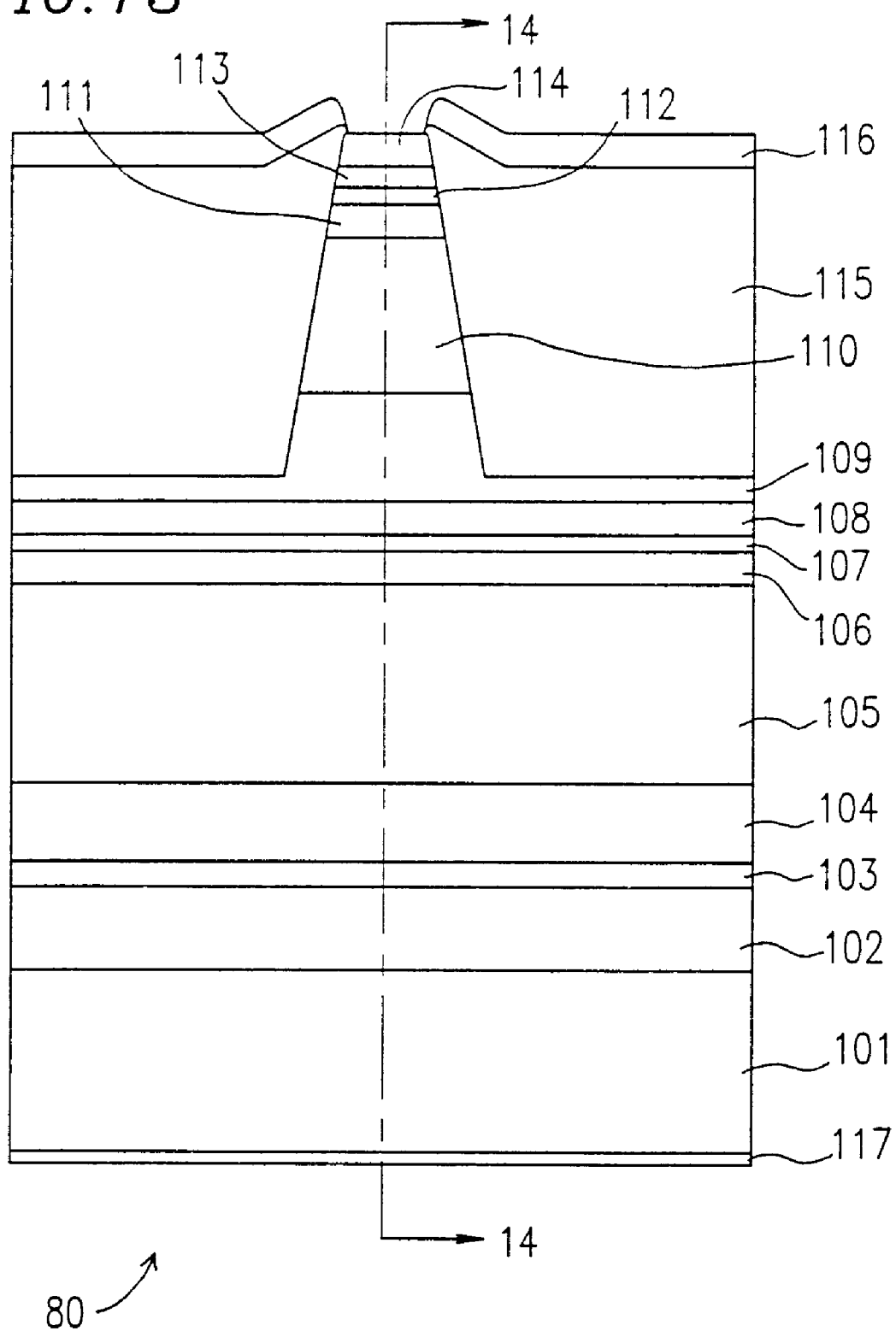
FIG. 13 is a cross-sectional view illustrating a configuration of a II–VI group type semiconductor laser employed in Example 5 of the invention.

FIG. 13 is a cross-sectional view illustrating a configuration of a distributed reflection type semiconductor laser 80 composed essentially of a II–VI group compound semiconductor, the cross-section being perpendicular to the optical axis of the semiconductor laser 80.

Specifically, the following layers are formed on an n-GaAs (100) substrate 101 in this order: an n-GaAs buffer layer 102; an n-ZnSe buffer layer 103; an n-ZnSSe cladding layer 104; an n-ZnMgSSe cladding layer 105; an n-ZnMgSSe optical guide layer 106; a ZnMgSSe multiple quantum well active layer 107; a p-ZnMgSSe optical guide layer 108; a p-ZnMgSSe cladding layer 109; a p-ZnSSe cladding layer 110; a p-ZnSe cap layer 111; a p-ZnTe/ZnSe pseudo slant layer 112; and a p-ZnTe contact layer 113. A p-electrode 114 is provided on the p-ZnTe contact layer 113. A portion of the p-ZnMgSSe cladding layer 109 and the layers thereabove are etched in a mesa stripe shape, where the mesa ridge has a bottom width of 4μm, for example. A current constriction layer 115 is formed over portions of the p-ZnMgSSe cladding layer 109 other than the mesa stripe, thereby forming an index-guided structure. Above the current constriction layer 115, an electrode 116 is formed so as to be in contact with the stripe-shaped p-electrode 114. On the other hand, an n-electrode 117 is formed on the lower face of the n-GaAs substrate 101.

Figure 14A:
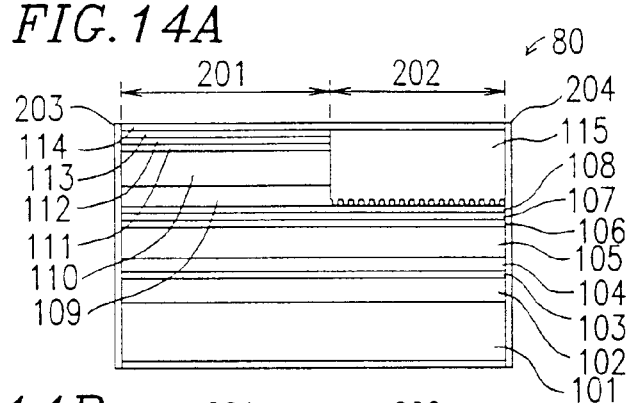
FIG. 14A is a cross-sectional view illustrating a configuration of a II–VI group type semiconductor laser employed in Example 5 of the invention.

FIG. 14A schematically illustrates an exemplary cross-section of the semiconductor laser 80, the cross sectional being parallel to the optical axis of the semiconductor laser 80 (taken at line 14—14 in FIG. 13). The semiconductor laser 80 includes an active region 201 and a distributed reflector region 202. The distributed reflector is formed directly above the p-ZnMgSSe optical guide layer 108, for example.

Crystals which can be employed for the substrate 101 include semiconductors of the sphalerite structure, e.g., GaAs, InGaAs, GaP, ZnSe, ZnS; and semiconductors of the diamond structure, e.g., Si and Ge. Although an n-substrate 101 is employed in the present example, it is also applicable to form a laser structure on a p-substrate. Although the (100) face is used for the substrate 101, it is also applicable to use a face which is tilted from the (100) face in the [111]A direction or the [111]B direction. For example, the (511)B face (which is tilted by 15.8° in the [111]B direction) or the (811)A face (which is tilted by 10.0° in the [111]A direction) can be used.

It is preferable to select the composition of the II–VI group compound semiconductor epitaxially grown on the substrate 101 so as to have a substantial lattice match with the substrate 101, thereby preventing misfit defects from occurring at the interface with the substrate 101. For a substrate of GaAs, InGaAs, ZnSe, Ge, or the like, a II–VI group compound semiconductor of a ZnMgSSe type or the ZnMgBeSe type can be selected, for example. On the other hand, for a substrate of GaP, ZnS, Si, or the like, a II–VI group compound semiconductor of a ZnMgBeSSe type can be selected, for example. In the case of selecting a composition with a large lattice mismatch with the substrate 101, it is preferable to prescribe the thickness of the layer at a critical thickness with such a composition or smaller.

As for the composition of the cladding layers of a semiconductor laser with an oscillation wavelength lower than 435 nm, $Zn_{0.6}Mg_{0.4}S_{0.5}Se_{0.5}$ can be selected for a ZnMgSSe type, for example, and $Zn_{0.6}Mg_{0.3}Be_{0.1}Se$ can be selected for a ZnMgBeSe type, for example. Although the present example will discuss laser structures employing a ZnMgSSe type material, it will be appreciated that a semiconductor laser with similar characteristics can be constructed from a ZnMgBeSe type material.

The GaAs buffer layer 102 is provided in order to provide a flat surface on the atom alignment level and to reduce the density of crystal defects in the II–VI group compound semiconductor formed thereon, so that a high-quality semiconductor laser crystal is obtained. The thickness of the GaAs buffer layer 102 can be 0.3 $\mu$m, for example. As an n-type impurity for doping the GaAs buffer layer 102, Si can be used, for example. As a p-type impurity for doping the GaAs buffer layer 102, Zn can be used, for example.

The n-ZnSe buffer layer 103 is provided in order to enhance the generation and growth of a two-dimensional nucleus and suppress the generation of lamination defects in the incipient growth stage of the n-ZnSSe cladding layer 104 to be grown thereupon. Since ZnSe has a lattice mismatch of about +0.28% with GaAs, its critical thickness is about 150 nm. Therefore, the thickness of the ZnSe buffer layer 103 is prescribed at 30 nm, for example. The effective donor density is $8 \times 10^{17}$ cm$^{-3}$, for example, and Cl can be used as a n-type impurity, for example. It is preferable not to add an impurity in a region spanning about 2 nm to about 3 nm adjoining the GaAs buffer layer 102 in order to minimize defects occurring due to the dispersion of the impurity into the GaAs interface.

A conduction band is discontinuous with a gap of about 0.6 eV between the n-GaAs substrate 101 and the n-ZnMgSSe cladding layer 105 to create a barrier against the electron injection. Therefore, the n-ZnSSe cladding layer 104 is provided to lower the barrier. As a result, the discontinuous gap in the conduction band is divided into about 0.3 eV each, thereby substantially eliminating the barrier against the electron injection. The ZnSSe cladding layer 104 has a composition with a S mole fraction of 0.06. The ZnSSe material having such a composition has a substantial lattice match with GaAs, and a band gap energy of 2.75 eV at room temperature. The n-ZnSSe cladding layer 104 can have a thickness of about 0.2 $\mu$m, for example, and an effective donor density of about $5 \times 10^{17}$ cm$^{-3}$, for example.

The n-ZnMgSSe cladding layer 105 and the p-ZnMgSSe cladding layer 109 have a composition with a Mg mole fraction of 0.4 and a S mole fraction of 0.5. The ZnMgSSe material having such a composition has a substantial lattice match with GaAs, and a band gap energy of 3.3 eV at room temperature. The band gap energy of the ZnMgSSe can be varied from about 2.7 eV to about 3.4 eV by appropriately selecting its composition, while maintaining a substantial lattice match with GaAs. The n-ZnMgSSe cladding layer 105 can have a thickness of about 0.8 $\mu$m, for example, and an effective donor density of about $3 \times 10^{17}$ cm$^{-3}$, for example. The p-ZnMgSSe cladding layer 109 can have a thickness of about 0.4 $\mu$m, for example, and an effective acceptor density of about $3 \times 10^{16}$ cm$^{-3}$, for example. As a p-type impurity, N can be used, for example.

The n-ZnMgSSe optical guide layer 106 and the p-ZnMgSSe optical guide layer 108 have a composition with a Mg mole fraction of 0.3 and a S mole fraction of 0.4. The ZnMgSSe material having such a composition has a substantial lattice match with GaAs, and a band gap energy of 3.2 eV at room temperature. The composition of each optical guide layer is selected so that its refractive index at the laser oscillation wavelength is larger than the refractive index of the cladding layers and smaller than the refractive index of the active layer, and that its band gap energy is smaller than the band gap energy of the cladding layers and the larger than the band gap energy of the active layer. The thickness of each optical guide layer can be about 0.1 $\mu$m, for example. It is preferable not to add impurities (whether it is p-type or n-type) in portions of the optical guide layers 106 and 108 that are in the vicinity of their interfaces with the ZnMgSSe MQW active layer 107 in order to prevent the formation of an impurity level in the ZnMgSSe MQW active layer 107. Alternatively, it is also applicable not to dope the entire optical guide layers 106 and 108 with any impurities at all (p-type or n-type). The optical guide layers 106 and 108 have an effective donor density of about $4 \times 10^{17}$ cm$^{-3}$, for example, and an effective acceptor density of about $6 \times 10^{16}$ cm$^{-3}$, for example.

The ZnMgSSe MQW active layer 107 includes, for example, alternating layers of three well layers (thickness: 4 nm) having a Mg mole fraction of 0.1 and a S mole fraction of 0.1, and two barrier layers (thickness: 6 nm) having the same composition as that of the optical guide layers. The well layers have a band gap energy of 2.9 eV at room temperature. The ZnMgSSe material having such a composition has a substantial lattice match with GaAs. The composition of the well layers is selected so as to have a band gap energy which is smaller than the band gap energy of the cladding layers and the band gap energy of the optical guide layers.

Although a lattice matched system is adopted for both the well layers and the barrier layers in the present example, it is also applicable to adopt a strained quantum well structure or a strain-compensated quantum well structure by controlling the amount of strain. It is preferable not to add impurities (whether it is p-type or n-type) in the well layers or the barrier layers in order to prevent the formation of an impurity level in the active layer.

The p-ZnSSe cladding layer 110 is provided in order to reduce the thermal resistance and serial resistance of the semiconductor laser 80 and to reduce the discontinuous gap in valence band. This provides an advantage of reducing the thickness of the p-ZnMgSSe cladding layer 109 having a large mole fraction and an insufficient effective acceptor density. The p-ZnSSe cladding layer 110 has a thickness of about 0.5 μm, for example, and an effective donor density of about $4 \times 10^{17}$ cm$^{-3}$, for example.

The p-ZnSe cap layer 111, the p-ZnTe/ZnSe pseudo slant layer 112, and the p-ZnTe contact layer 113 are provided for achieving p-type ohmic contact. The p-ZnSe cap layer 111 has a thickness of about 80 nm, for example, and an effective acceptor density of about $8 \times 10^{17}$ cm$^{-3}$, for example. The p-ZnTe contact layer 113 has a thickness of about 50 nm, for example, and an effective acceptor density of about $1 \times 10^{19}$ cm$^{-3}$, for example. Although an ohmic electrode can be easily formed upon the p-ZnTe contact layer 114, a discontinuous gap in the valence band of about 0.8 eV exists between ZnSe and ZnTe to create a barrier against the hole injection. Therefore, the p-ZnTe/ZnSe pseudo slant layer 112 is provided in order to eliminate this barrier. The p-ZnTe/ZnSe pseudo slant layer 112 can have a 12-layer structure with a period of 2.1 nm, for example, including a first layer (adjoining the p-ZnSe cap layer 111) composed of a 0.3 nm thick p-ZnTe layer and a 1.8 nm thick p-ZnSe layer, a second layer composed of a 0.4 nm thick p-ZnTe layer and a 1.7 nm thick p-ZnSe layer, a third layer composed of a still thicker p-ZnTe layer and a still thinner p-ZnSe layer, . . . , and a twelfth layer (adjoining the p-ZnTe contact layer 113) composed of a 1.8 nm thick p-ZnTe layer and a 0.3 nm thick p-ZnSe layer. Alternatively, any structure in which the band structure macroscopically transits from ZnSe to ZnTe gradually, or any structure in which holes can flow through the barrier between ZnTe and ZnSe owing to a tunnel effect, or a combination of both, can be adopted. For example, a mixed crystal such as ZnSeTe can be used; or, p-ZnTe quantum well structure can be provided closer to the p-ZnSe cap layer 111.

The p-ohmic contact layer can also be formed of BeTe. Such a p-ohmic contact layer is applicable to a II–VI group semiconductor device by being combined with a p-BeTe/ZnSe pseudo slant layer, a BeSeTe mixed crystal, a BeTe quantum well structure, etc., of similar materials. BeTe has about −0.47% lattice mismatch with GaAs, and is advantageous in that it is capable of achieving ohmic contact with high crystal quality at a thickness below the critical thickness, unlike in the case of ZnTe.

As the p-type electrode 114, an AuPd electrode can be used, for example, in which Pd films (thickness: 10 nm) and Au films (thickness: 600 nm) are stacked alternately. As the n-type electrode 117, an AuGeNi electrode can be used, for example.

The material and composition of the current constriction layer 115 are selected in accordance with the refractive index of the cladding layers. For example, ZnMgSSe, ZnMgBeSe, ZnO, and the like are preferable materials.

As the method for growing a laser structure of the semiconductor laser 80 described above, a molecular beam epitaxy method, an organic metal vapor epitaxy method, or the like can be used. In the case where accurate control on a molecular layer level or an atomic layer level is required, an atomic layer epitaxy method or a migration enhanced epitaxy method can be used.

Hereinafter, a manufacture process by a molecular beam epitaxy method will be described.

FIG. 15 is a conceptual diagram representing a molecular beam epitaxy apparatus.

This apparatus includes a load lock chamber 301, a III–V group semiconductor growth chamber 302, a substrate conveyance chamber 303, and a II–VI group semiconductor growth chamber 304. A substrate retention/heating mechanism 305 and heating evaporation sources 306 are provided in the III–V group semiconductor growth chamber 302 and the II–VI group semiconductor growth chamber 304. In the III–V group semiconductor growth chamber 302, a Ga source, an As source, a Si source, and a Zn source, for example, are provided as the heating evaporation sources 306. In the II–VI group semiconductor growth chamber 304, a ZnSe source, a ZnS source, an Mg source, a ZnTe source or a BeTe source, and a ZnCl$_2$ source, for example, are provided as the heating evaporation sources 306. The II–VI group semiconductor growth chamber 304 is further equipped with an N$_2$ radical source 307 having a radiofrequency discharge tube. It is also applicable to provide a heating evaporation sources filled with Zn, Se, S, Cd, Be, Te, and the like, instead of a ZnSe source, a ZnS source, a ZnTe source.

In accordance with the apparatus shown in FIG. 15, a Zn molecular beam irradiation can be performed immediately after forming the n-GaAs buffer layer 102 on the substrate in the III–V group semiconductor growth chamber 302, so that the surface of the GaAs substrate is terminated with a few layers of Zn atoms. As a result, the formation of Ga—Se bonds and Ga—S bonds can be prevented from occurring at the interface between the II–VI semiconductor and GaAs, thereby preventing lamination defects due to such bonds.

The Si-doped n-GaAs (100) substrate 101 (carrier density: $2 \times 10^{18}$ cm$^{-3}$) is prebaked in the load lock chamber 301 at 350° C., and then conveyed through the substrate conveyance chamber 303 (maintained at a vacuum of about $1 \times 10^{-10}$ Torr) to the III–V group semiconductor growth chamber 302. After removing the native oxidation film by heating the GaAs substrate 101 to about 600° C. while irradiating the substrate with an As molecular beam, Ga, As, and Si molecular beams are radiated so as to grow the Si-doped n-GaAs buffer layer 102. Assuming that the intensities of the Ga and As molecular beams are about $5 \times 10^{-7}$ Torr and $1 \times 10^{-5}$ Torr, respectively, for example, and the substrate 101 is maintained at a temperature of about 590° C., for example, a growth rate of 0.9 μm/h is obtained.

After the growth of the n-GaAs buffer layer 102, a Zn molecular beam is radiated on the surface of the GaAs buffer layer 102 while lowering the temperature of the substrate to about 300° C. Thus, the GaAs surface is terminated with Zn. For example, the intensity of the molecular beam from the heating evaporation source can be $1 \times 10^{-6}$ Torr, and the irradiation can be performed for 30 seconds. It can be confirmed by high-speed electron beam diffraction that the restructured surface is thus changed from a (2×4) structure (indicative of an As stabilized face of GaAs) into a (1×4) structure (indicative of the face terminated with Zn).

The substrate 101 on which the n-GaAs buffer layer 102 (terminated with Zn) has been formed is conveyed through the substrate conveyance chamber 303 to the II–VI group semiconductor growth chamber 304. In the II–VI group semiconductor growth chamber 304, the following layers are formed on the n-GaAs buffer layer 102 in this order: the n-ZnSe buffer layer 103; the n-ZnSSe cladding layer 104; the n-ZnMgSSe cladding layer 105; the n-ZnMgSSe optical guide layer 106; the ZnMgSSe MQW active layer 107; the p-ZnMgSSe optical guide layer 108; the p-ZnMgSSe cladding layer 109; the p-ZnSSe cladding layer 110; the p-ZnSe cap layer 111; the p-ZnTe/ZnSe pseudo slant layer 112; and the p-ZnTe contact layer 113. As the n-type impurity, $ZnCl_2$ can be used, for example. As the p-type impurity, active $N_2$ generated by radiofrequency plasma discharge can be used, for example. The substrate temperature during the crystal growth can be set at 290° C., for example. The growth rate of the ZnMgSSe cladding layer can be 0.7 $\mu$m/h, for example.

The laser structure of the semiconductor laser 80 of the present example employs a different composition of ZnMgSSe for each of the quantum well layer, the optical guide layers, and the cladding layers. Therefore, in order to form each layer with mixed crystal of a uniform composition, it is necessary to accurately control the molecular beam intensities of the constituent elements and the ratio between the intensities during the growth of each layer. In general, the molecular beam intensities of the constituent elements and the ratio between the intensities can be controlled by controlling the temperatures of the heating evaporation sources or the opening/closing ratios of the valves of valved heating evaporation sources.

On the contrary, by forming each layer with a supper lattice combining binary mixed alloy compounds or quaternary mixed alloy crystals, the complexity of controlling molecular beam intensities will be reduced, so that the laser structure of the present example can be formed simply by opening/closing of the shutters of the heat evaporation sources.

For example, the temperatures of the heating evaporation sources of ZnSe and Mg can be fixed at the temperatures required for forming a ZnMgSSe cladding layer having a Mg mole fraction of 0.4 and a S mole fraction of 0.5, and the temperature of the ZnS heating evaporation means can be switched between a temperature required for forming a ZnSSe cladding layer having a S mole fraction of 0.06 and a temperature required for forming a ZnMgSSe cladding layer having a Mg mole fraction of 0.4 and a S mole fraction of 0.5.

By providing two ZnS heating evaporation sources, it becomes possible to fix the temperatures of all the heating evaporation sources. Alternatively, by employing a valved ZnS heating evaporation source, it becomes possible to obtain the molecular beam intensities required for growing the above two compositions by appropriately switching the opening/closing ratios of the valve. Such technique provides an advantage in that the growth process can be continuously performed without being interrupted because the ZnS molecular beam intensity can be instantaneously changed.

The laser structure according to the present example obtained by using the above-mentioned technique is as follows:

The ZnSSe cladding layers and the ZnMgSSe cladding layers are composed of a mixed crystal having a uniform composition including a S mole fraction of 0.06, and a mixed crystal having a uniform composition including a Mg mole fraction of 0.4 and a S mole fraction of 0.5, respectively. The ZnMgSSe optical guide layers are constructed by, for example, stacking 23 periods of a supper lattice where each period includes a ZnSe (thickness: 1.1 nm) and $Zn_{0.6}Mg_{0.4}S_{0.5}Se_{0.5}$ (thickness: 3.4 nm). The ZnMgSSe quantum well layer is constructed by, for example, stacking 2 periods of a short period supper lattice (period: about 2 nm) where each period includes 3 molecular layers of ZnSe, 1 molecular layer of ZnS, 3 molecular layers of ZnSe, and 1 molecular layer of MgSe. The ZnMgSSe barrier layer is constructed by, for example, stacking 6 periods of a short period supper lattice (period: about 1 nm) where each period includes 1 molecular layer of ZnSe and 3 molecular layers of $Zn_{0.6}Mg_{0.4}S_{0.5}Se_{0.5}$. By adopting this structure, it is possible to form the layered structure from the n-ZnMgSSe cladding layer 105 through the p-ZnMgSSe cladding layer 109 shown in FIG. 13 by simply controlling the opening/closing of the shutters of the heating evaporation sources, at least without interrupting the growth.

A wafer having the laser structure obtained through the above-described epitaxial growth process is further processed into a distributed reflection type semiconductor laser 80 shown in FIGS. 13 and 14A as follows.

First, Pd and Au are sequentially vacuum-deposited over the entire surface of the wafer to form the p-electrode 114. Then, the p-ZnMgSSe cladding layer 109 is partially etched away so as to form a mesa stripe having a width of 4 $\mu$m and a length of 600 $\mu$m, for example.

Either wet etching or dry etching can be adopted. In the case of wet etching, for example, the p-electrode 114 is etched with an aqueous solution of potassium iodide, followed by etching the II–VI group compound semiconductor layers with an etchant mixture containing a saturated aqueous solution of potassium dichromate and conc. $H_2SO_4$ at a volume ratio of 3:2. In the case of dry etching, Ar ion milling, a reactive ion etching with $BCl_3$, or the like can be employed.

Figure 14B:
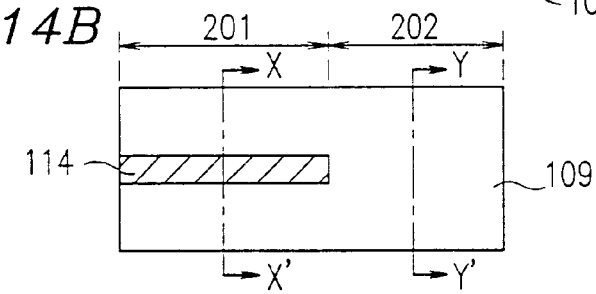
Figure 14C:
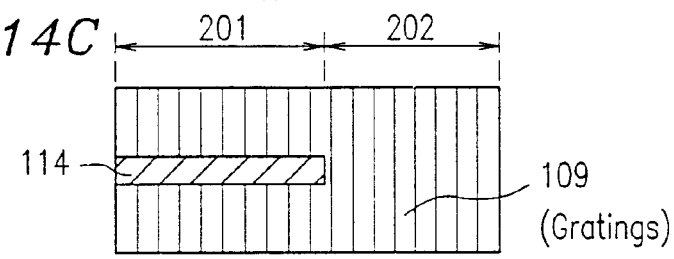

Next, the distributed reflector region 202 having a length of 400 $\mu$m, for example, is formed on the p-ZnMgSSe cladding layer 109 immediately above the p-ZnMgSSe optical guide layer 108 and adjacent one end of the mesa stripe region (corresponding to the active region 201 in FIG. 14A). FIG. 14B is a plan view illustrating the laser structure shown in FIG. 14A, where the cladding layer 109 is in an exposed state. Thereafter, as shown in FIG. 14C, a diffraction grating is formed on the cladding layer 109 by performing the wet etching of the p-ZnMgSSe cladding layer 109 with using a resist mask formed by laser interference exposure. The diffraction grating can have a pitch of 185 nm based on secondary diffraction, for example. Alternatively, the diffraction grating can have a pitch of 277 nm based on tertiary diffraction, for example. The diffraction grating needs to be formed at least in the region 202, and in the illustrative structure, the diffraction grating is formed over all the surface of the cladding layer 109 excluding the stripe including the p-electrode 114.

Instead of the aforementioned chromic mixture acid, a bromine type etchant such as saturated bromine water or bromomethanol liquid can be used for the etching.

Figures 1, 14D:
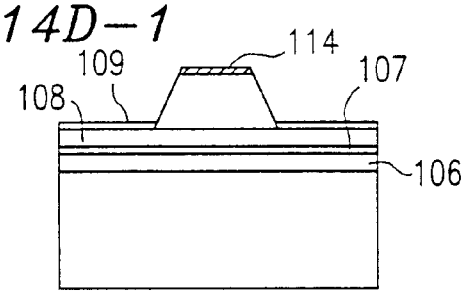
Figures 2, 14D:
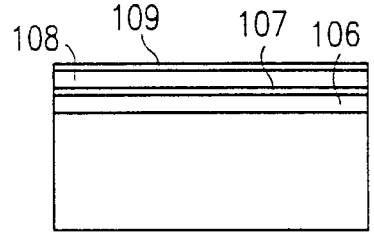

FIG. 14D-1 is a cross-sectional view taken at line X–X' in FIG. 14B, and FIG. 14D-2 is a cross-sectional view taken at line Y–Y' in FIG. 14B. Each of these figures illustrates the structure in a direction perpendicular to the cavity length direction where the diffraction grating has been formed over the cladding layer 109.

Figures 1, 14E:
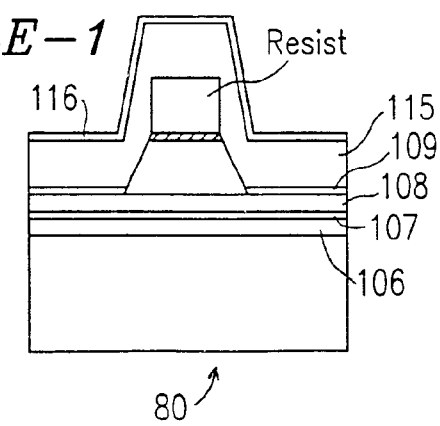
Figures 2, 14E:
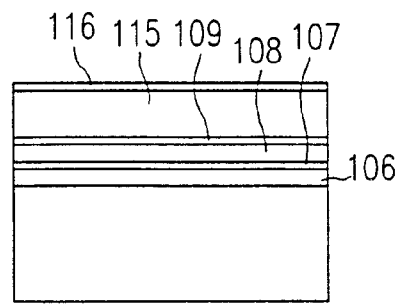

Furthermore, as shown in FIGS. 14E-1 and 14E-2 which are also cross-sectional views taken at line X–X' and at line Y–Y' in FIG. 14B, respectively, after the formation of a resist mask on the stripe-shaped p-electrode 114, the current constriction layer 115 (e.g., a ZnO layer) and the electrode 116 (e.g., an Au electrode) which covers the current constriction layer 115 are consecutively vacuum deposited. The thickness of the current constriction layer 115 is made substantially equal to the mesa height, so that the mesa stripe is buried therein. Thereafter, the p-electrode 114 is exposed by a lift-off technique. As the current constriction layer 115, ZnOS or ZnMgSSe can be employed instead of ZnO. By optimizing its refractive index, it becomes possible to realize a high-efficiency waveguide coupling between the active region 201 and the distributed reflector region 202.

An electrode for facilitating the mounting of the laser device can be optionally provided on the p-electrode 114 and/or the electrode 116. In addition, Ni, Ge, and Au, for example, are vacuum deposited on the lower face of the n-GaAs substrate 101 to form the n-electrode 117.

Thereafter, the wafer is cleaved, and a reflection film 203 having appropriate reflectance is formed on the outgoing end face (i.e., opposite the end face adjacent the distributed reflector) by vacuum deposition or sputtering. The reflection film 203 can be composed of a ¼ wavelength multilayer film of a dielectric material which does not induce absorption even in the short wavelength region of about 400 nm, e.g., silicon oxide or titanium oxide. The reflectance is preferably set to be about 50% to 70% in order to reduce noises of the semiconductor laser induced by the returned light and to obtain an optical output of about 30 mW with low power consumption. Such reflectance can be obtained by, for example, forming one layer of a silicon oxide film having a thickness corresponding to ¼ wavelength and a titanium oxide film having a thickness corresponding to ¼ wavelength on the end face of the laser device.

On the end face of the laser device adjacent the diffraction grating, a low reflection or absorption film 204 is formed in order to suppress oscillation at a complex cavity mode. A low reflection film can be composed of a dielectric material such as silicon oxide, aluminum oxide, or titanium oxide. Substantially zero reflectance can be obtained by controlling the refractive index, thickness, and/or multilayer structure of the low reflection film. An absorption film can be composed of a semiconductor film having an appropriate thickness with a band gap sufficiently smaller than that of the waveguide layer of ZnSe, Si, or the like. The thickness of the semiconductor film is selected so that the light transmitted through the distributed reflector region 202 having a reflectance over 99% is sufficiently attenuated and substantially absorbed by the absorption film. For example, a Si film having a thickness of 400 nm can be formed by chemical vapor deposition.

The operation characteristics of the DBR semiconductor laser 80 of the present example mounted in an optical pickup are as follows: oscillation wavelength of 427 nm; operation current of 95 mA; operation voltage of 5.6 V; aspect ratio of 2.4; and astigmatic deviation of 5 µm with an output power of 30 mW at an ambient temperature of 25° C. The DBR semiconductor laser 80 has a RIN level of –137 dB/Hz at an output power of 5 mW. The shift in the oscillation wavelength at an ambient temperature in the range of about –10° C. to about 60° C. is about 1.5 nm. The laser device stably operates with low noise even under the condition with the 5% returned light.

Next, an optical pickup incorporating the above semiconductor laser 80 is constructed. FIG. 16 schematically shows a partial structure thereof.

The optical pickup at least includes a laser, an optical system, and an optical detection system. A polarization hologram 58a is employed for the optical system. Specifically, the laser light emitted from the II–VI group semiconductor laser 80 (wavelength: 427 nm) is collimated through a collimation lens 51, deflected by a prism 63, led through a polarization hologram 58a and a ¼ wavelength plate 59, and converged by a focus lens 52 so as to be radiated on pits formed in an optical disk medium (not shown). The signal light from the optical disk medium is collimated by the focus lens 52 and has its polarization direction turned by the ¼ wavelength plate 59 by 90° relative to its polarization direction before being returned from the optical disk medium. Thereafter, the signal light passes the polarization hologram 58a and deflected by the prism 63 so as to be converged on optical detectors 57.

A portion of the laser light is separated by the prism 63 so as to enter a detector 64 for output monitoring, thereby controlling the power of the semiconductor laser 80. The polarization hologram 58a, the focus lens 52, and the like are driven by a movable unit 62.

The pits formed in an optical disk medium have a length of about 0.28 µm and a track pitch of about 0.50 µm. The experiments by the present inventors have shown that excellent HDTV images free of noise can be reproduced.

Thus, a low-noise optical pickup for high-density optical recording/reproduction having small wavelength variation can be realized by using the II–VI group semiconductor laser 80 of the present example. RF superimposition has also been shown to be effective for controlling returned light.

As described above, the optical pickup according to the present invention is capable of recording and/or reproducing data in pits provided at higher densities than conventional pit densities. By employing a wavelength-locked semiconductor laser (e.g., a DBR laser) as a light source, the noise of the optical pickup is minimized.

When optical recording is performed with a high-power semiconductor laser according to the present invention, the oscillation wavelength of the semiconductor laser has a very small variation due to wavelength locking when switching its operation from recording to reproduction. Therefore, problems due to the wavelength dependency of the optical characteristics (refractive index) of the lens material are prevented. This substantially eliminates the constraints on the lens material. Since the oscillation wavelength is locked, it is also possible to employ a diffraction type lens, etc.

By forming a tapered portion at the outgoing end face of the semiconductor laser so as to bring the beam aspect ratio to the proximity of 1, the effective transmission ratio can be greatly improved. As a result, a low-output laser can be used as the semiconductor laser, thereby realizing a prolonged lifetime for the device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An optical pickup comprising:
   a laser light source having an oscillating wavelength of 435 nm or less;
   an optical system providing light emitted from the laser light source with a prescribed optical path; and
   an optical detector for detecting light from the optical system,
   wherein optical feedback of the laser light source is induced by a grating structure of the laser light source so that the laser light source itself performs wavelength locking of light emitted from the laser light source, and a low-reflection or absorbing member is provided on an end face of the laser light source opposite to a light emitting portion thereof for substantially absorbing laser light not reflected by the grating structure.

2. An optical pickup according to claim 1, wherein the laser light source is a GaN type semiconductor laser.

3. An optical pickup according to claim 1, wherein the grating structure is external to the laser light source.

4. An optical pickup according to claim 1, wherein the grating structure of the laser light source is a DBR structure.

5. An optical pickup according to claim 4, wherein the DBR structure is formed in the vicinity of an end face opposite to a light emitting portion of the semiconductor laser.

6. An optical pickup according to claim 4, wherein the low-reflection or absorbing member is provided on the end face of the laser light source adjacent the grating structure.

7. An optical pickup according to claim 1, wherein a tapered beam-shaping portion is provided on the side of a light emitting portion of the laser light source.

8. An optical pickup according to claim 1, wherein the laser light source is operated with RF superimposition.

9. An optical pickup according to claim 1, wherein the laser light source is a semiconductor laser having a level of a relative intensity of noise (RIN) of −135 dB/Hz or less.

* * * * *